(12) United States Patent  
Du et al.

(10) Patent No.: US 8,386,013 B2
(45) Date of Patent: Feb. 26, 2013

(54) MAGNETIC RESONANCE IMAGING (MRI) USING ULTRA SHORT ECHO TIMES AND SPIRAL SAMPLING IN K-SPACE

(75) Inventors: Jiang Du, San Diego, CA (US); Mark Bydder, San Diego, CA (US); Graeme M. Bydder, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 1415 days.

(21) Appl. No.: 11/735,381

(22) Filed: Apr. 13, 2007

(65) Prior Publication Data

US 2007/0255129 A1 Nov. 1, 2007

Related U.S. Application Data

(60) Provisional application No. 60/792,010, filed on Apr. 13, 2006.

(51) Int. Cl.
*A61B 5/05* (2006.01)
(52) U.S. Cl. .................. 600/410; 324/307; 324/309
(58) Field of Classification Search .............. 600/410; 324/307, 309
See application file for complete search history.

(56) References Cited

U.S. PATENT DOCUMENTS

| 4,581,581 | A | 4/1986 | Pelc |
| 4,706,026 | A | 11/1987 | Pelc et al. |
| 4,751,462 | A | 6/1988 | Glover et al. |
| 6,983,182 | B2 | 1/2006 | Mistretta |
| 7,218,110 | B2 * | 5/2007 | Zhang et al. .................. 324/309 |
| 7,358,730 | B2 | 4/2008 | Mistretta et al. |
| 7,368,910 | B2 * | 5/2008 | Bammer et al. .............. 324/306 |
| 7,408,347 | B2 | 8/2008 | Mistretta et al. |
| 2003/0013953 | A1 | 1/2003 | Mistretta |
| 2007/0167729 | A1 | 7/2007 | Mistretta et al. |
| 2007/0255128 | A1 | 11/2007 | Nistler |
| 2007/0255130 | A1 | 11/2007 | Du |
| 2008/0045833 | A1 | 2/2008 | Defreitas et al. |
| 2009/0009167 | A1 | 1/2009 | Du |

FOREIGN PATENT DOCUMENTS

WO WO 2005026748 A2 * 3/2005

OTHER PUBLICATIONS

Alley et al., "Gradient characterization using a Fourier-transform technique," Magn. Reson. Med. 39: 581-587 (1998).
Amann, M. et al., "Three-dimensional spiral MR imaging: application to renal multiphase contrast-enhanced angiography," Magn. Reson. Med. 48: 290-296 (2002).
Barger, A.V. et al., "Time-resolved contrast-enhanced imaging with isotropic resolution and broad coverage using an undersampled 3D projection trajectory,". Magn Reson Med. 48:297-305 (2002).
Bergin, C.J. et al., "Lung parenchyma: projection reconstruction MR imaging," Radiology 179:777-781 (1991).

(Continued)

*Primary Examiner* — Brian Casler
*Assistant Examiner* — Daniel Huntley
(74) *Attorney, Agent, or Firm* — Perkins Coie LLP

(57) ABSTRACT

Methods, systems and computer program products of magnetic resonance imaging (MRI) using ultra short echo times and spiral sampling in k-space are disclosed. A long inversion radio frequency (RF) pulse that inverts magnetization of long T2 components are applied to a sample that exhibits long transverse relaxation time (T2) components and short T2 components to minimize signals corresponding to the long T2 components. In addition, half RF excitation pulses are applied to the sample to select one or more echo times. Data corresponding to the selected one or more echo times are acquired using a spiral trajectory, and a first echo image is obtained based on the acquired data.

20 Claims, 22 Drawing Sheets

OTHER PUBLICATIONS

Bothakur, A. et al., "NMR studies of exchangeable hydrogen in bone," In: Proceedings of the 6$^{th}$ Annual Meeting of ISMRM, Sydney, Australia, p. 1804 (1998).

Brittain, J.H. et al., "Ultra-Short TE imaging with single-digit (8 microsecond) TE," In: Proceedings of the 12$^{th}$ Annual Meeting of ISMRM, Kyoto, Japan, 2004, p. 629.

Brossmann, J et al., "Short echo time projection reconstruction MR imaging of cartilage: comparison with fat-suppressed spoiled GRASS and magnetization transfer contrast MR imaging," Radiology 203(2):501-507 (1997).

Brown, T.R. et al., "NMR chemical shift imaging in three dimensions," Proc Natl Acad Sci USA 79:3523-3526 (1982).

Cho, G. "Detection of hydroxyl ions in bone mineral by solid-state NMR spectroscopy," Science 300:1123-1127 (2003).

Conolly, S. et al., "Variable-rate selective excitation," J Magn Reson 78:440-458 (1988).

De Graaf, A.A. et al., "Quality: Quantification Improvement by Converting Lineshapes to the Lorentzian Type," Magn Reson Med 13:343-357 (1990).

Du et al., "Time-resolved Three-dimensional Pulmonary MR Angiography Using a Spiral-TRICKS sequence," Proc. Int. Soc. Mag. Reson. Med. 14:3635 (2006).

Du, J. et al., "Contrast Enhanced Peripheral Magnetic Resonance Angiography Using Time-Resolved Vastly Undersampled Isotropic Projection Reconstruction," J. Magnetic Resonance Imaging, 20:894-900 (2004).

Du, J. et al., "Time-resolved, undersampled projection reconstruction imaging for high resolution CE-MRA of the distal runoff vessels," Magn Reson Med 48:516-522 (2002).

Du, J. et al., "Time-resolved undersampled projection reconstruction Magnetic Resonance imaging of the peripheral vessels using multi-echo acquisition," Magn. Reson. Med. 53: 730-734 (2005).

Du, J. et al., "Multi-echo ultrashort TE (UTE) imaging and T2 mapping of knee cartilage," In: Proceedings of the 14$^{th}$ Annual Meeting of Int. Soc. Mag. Reson. Med., Seattle, USA, 2006, p. 57.

Du, J. et al., "Ultrashort Echo Time Spectroscopic Imaging (UTESI) of Cortical Bone," Magnetic Resonance in Medicine 58: 1001-1009 (2007).

Du, J. et al., "Ultrashort TE Spectroscopic Imaging (UTESI): Application to the Imaging of Short T2 Relaxation Tissues in the Musculoskeletal System," Journal of Magnetic Resonance Imaging, submitted for publication on Nov. 9, 2007, currently in press, 74 pages.

Du, J. et al., "Ultrashort TE (UTE) Spectroscopic Imaging of Cortical Bone Using a Variable TE Acquisition and Sliding Window Reconstruction," Proc. Intl. Soc. Mag. Reson. Med. 15: 421 (2007), Joint Annual Meeting ISMRM-ESMRMB, May 19-25, 2007, Berlin, Germany.

Du, J. et al., "Spectroscopic Imaging of the Knee Using an Interleaved Ultrashort TE(UTE) Sequence, " Proc. Intl. Soc. Mag. Reson. Med. 15: 1240 (2007), Joint Annual Meeting ISMRM-ESMRMB, May 19-25, 2007, Berlin, Germany.

Du, J. et al., "Ultrashort TE Imaging of the Short T2 components in White Matter Using Half Pulse Excitation and Spiral Sampling," Proc. Intl. Soc. Mag. Reson. Med. 14: 334 (2006).

Duyn, J.H. et al., "Simple correction method for k-space trajectory deviations in MRI," J Magn Reson 132:150-153 (1998).

Fantazinni P., R.J.S. Brown RJS, and C. Ganavaglia, "NMR relaxation in trabecular and cortical bone," Abstracts 15th International Bone Densitometry Workshop, Monterey, Jul. 22-26, 2002 in *Calcified Tissue International*, vol. 71, No. 3, Sep. 2002, p. 275.

Gatehouse, P.D. and G.M. Bydder, "Magnetic resonance imaging of short T$_2$ components in tissue,". Clin Radiol 58:1-19 (2003).

Gatehouse, P.D. et al., "Magnetic resonance imaging of the knee with ultrashort TE pulse sequences," Magn Reson Imaging 22:1061-1067 (2004).

Glover, G.H., "Simple analytic spiral k-space algorithm," Magn. Reson. Med. 42: 412-415 (1999).

Gold, G.E. et al., "MR spectroscopic imaging of collagen: tendons and knee menisci," Magn Reson Med 34:647-654 (1995).

Gold, G.E. et al., "MR imaging of articular cartilage of the knee: new methods using ultrashort Tes," AJR 1998; 170:1223-1226 (May 1998).

Gold et al., "Short Echo Time MR Spectroscopic Imaging of the Lung Parenchyma," Journal of Magnetic Resonance Imaging 15: 679-684 (2002).

Gurney, P. et al. "Long-T2 suppressed Ultra Short-TE 3DPR Imaging," Proc. Intl. Soc. Mag. Reson. Med. 13:787 (2005).

Henkelman, R.M. et al., "Magnetization transfer in MRI: a review," NMR in Biomed 14:57-64 (2001).

Herlihy, A.H. et al., "MRI visualization of wood samples with ultrashort TE sequences," Proc. Intl. Soc. Magn. Reson. Med. 13: 2355 (2005).

Jehenson, P. et al., "Analytical method for the compensation of Eddy-current effects induced by pulsed magnetic field gradient in NMR systems,". J Magn Reson 90:264-278 (1990).

Josan, S, et al., "Double Half RF Pulse for Reduced Sensitivity to Linear Eddy Currents in Ultrashort T2 Imaging," Proc. Intl. Soc. Mag. Reson. Med. 14: 3004 (2006).

Joseph, P.M. and J. Whitley, "Experimental simulation evaluation of ECG-gated heart scans with a small Number of views," Med Phys 10(4):444-449 (Jul./Aug. 1983).

Kaye, E. et al., "Consistency of Signal Intensity and R2 in Frozen Porcine Kidney and Liver," Proc. Intl. Soc. Mag. Reson. Med. 14: 1423 (2006).

King , K. et al., "Optimized gradient waveforms for spiral scanning," Magn. Reson. Med. 34: 156-160 (1995).

Korosec, F.R. et al., "Time-resolved contract-enhanced 3D MR angiography," Magn. Reson. Med. 36: 345-351 (1996).

Larkman, D.J., "Parallelised sequences," European Society for Magnetic Resonance in Medicine and Biology (ESMRMB Teaching Syllabus 2005) http://www.esmrmb.org/html/img/pool/07_Larkman. pdf.

Larson, P.E. et al., "Using Adiabatic Inversion Pulses to Suppress Long-T$_2$ Species in Ultra-short Echo Time (UTE ) Imaging," Proc. Intl. Soc. Mag. Reson. Med. 13: 786 (2005).

Larson, P.E. et al., "Designing long-T$_2$ suppression pulses for ultrashort echo time imaging," Magn Reson Med 56:94-103 (2006).

Lee, J.H. et al., "Fast 3D imaging using variable-density spiral trajectories with applications to limb perfusion," Magn. Reson. Med. 50: 1276-1285 (2003).

Lu, A. et al., "Improved slice excitation for ultra-short TE imaging with B0 and linear eddy current correction," in: Proc. Intl. Soc. Mag. Reson. Med. 14: 2381 (2006).

Lustig, M. et al., "Fast Spiral Fourier Transform for Iterative MR Image Reconstruction," IEEE International Symposium on Biomedical Imaging: Nano to Macro, 2004, pp. 784-787 (Apr. 15-18, 2004).

Maudsley, A.A. et al., "Spatially resolved high resolution spectroscopy by 'four-dimensional' NMR," J Magn Reson 51:147-152 (1983).

Meyer, C.H., "Fast spiral coronary artery imaging," Magn Reson Med 28: 202-213 (1992).

Mierisova, S. and M. Ala-Korpela, "MR spectroscopic quantification: a review of frequency domain methods," NMR in Biomed 14:247-259 (2001).

Mistretta, C.A., "Highly constrained backprojection for time-resolved MRI," Magn Reson Med 55:30-40 (2006).

Mistretta, C.A. et al., "3D Time-Resolved Contrast-Enhanced MR DSA Advantages and Tradeoffs," Magn. Reson. Med. 40: 571-581 (1998).

Noll, N.C. et al., "Deblurring for non-2D Fourier transform magnetic resonance imaging," Magn Reson Med 25:319-333 (1992).

Panting, J.R. et al., "Abnormal Subendocardial Perfusion in Cardiac Syndrome X Detectedby Cardiovascular Magnetic Resonance Imaging," The New England Journal of Medicine 346: 1948-1953 (2002).

Pauly, J. et al., "Suppression of long T2 components for short T2 imaging," In: Proceedings of the 10$^{th}$ annual meeting of SMRI, New York, USA 1992, Abstract No. 330., p. 145.

Peters, D.C. et al., "Undersampled projection reconstruction applied to MR angiography," Magn Reson Med 43:91-101 (2000).

Rahmer, J. et al., "Three-dimensional radial ultrashort echo-time imaging with T$_2$ adapted sampling," Magn Reson Med 55:1075-1082 (2006).

Reichert, I.L.H., "Magnetic resonance imaging of periosteum with Ultrashort TE pulse sequences," J Magn Reson Imaging 19:99-107 (2004).
Reichert, I.L.H., et al., "Magnetic resonance imaging of cortical bone with ultrashort TE pulse sequences," Magn Reson Imag 23: 611-618 (2005).
Robson, M.D. et al., "Magnetic resonance: an introduction to Ultrashort TE (UTE) imaging," J Comput Assist Tomogr 2003;27(6):825-846 (2003).
Robson, M.D. et al., "Ultrashort TE chemical shift imaging (UTE-CSI)," Magn Reson Med 53:267-274 (2005).
Sartoris, D.J., "Quantitative bone mineral analysis," Chaper 18 In: *Bone and Joint Imaging*, D. Resnick, editor. Philadelphia: WB Saunders; 1996. p. 154-164.
Schroeder, C. et al., "Slice Excitation for Ultrashort TE Imaging," Proc. Intl. Soc. Mag. Reson. Med. 11: 628 (2004).
Schroeder, C. et al., "Scan Time Reduction for Ultrashort TE Imaging at 3T," Proc. Intl. Soc. Mag. Reson. Med. 11: 630 (2004).
Silver, M.S. et al., "Highly selective $\pi/2$ and $\pi$ pulse generation," J Magn Reson 59:347-351 (1984).
Song, H.K. and F.W. Wehrli, Variable TE gradient and spin echo sequences for in vivo MR microscopy of short $T_2$ species. Magn Reson Med 39:251-258 (1998).
Stoyanova, R. et al., "Application of principal-component analysis for NMR spectral quantification," J Magn Reson Series A 115:265-269 (1995).
Sussman, M.S. et al., "Design of practical $T_2$-selective RF excitation (TELEX) pulses," Magn Reson Med 40:890-899 (1998).
Takahashi, A.M., "Ultrashort TE (UTE) imaging at 8 µsec with 3D vastly undersampled isotropic projection reconstruction (VIPR)," Proc. Intl. Soc. Mag. Reson. Med. 13: 2405 (2005).
Techawiboonwong, A. et al., "Quantification of bone-water concentration in a 3T whole-body imager using solid-state imaging," In: Proceedings of the 14th Annual Meeting of ISMRM, Seattle, USA, 2006, p. 3620.
Vasnawala et al., "MR imaging of knee cartilage with FEMR," Skeletal Radiol 31: 574-580 (2002).
Vigen, K.K., "Undersampled Projection-Reconstruction Imaging for Time-Resolved Contract-Enhancing Imaging," Magn. Reson. 43: 170-176 (2000).
Waldman et al., "MRI of the brain with ultrashort echo-time pulse sequences," Neuroradiology 45: 887-892 (2003).
Wanspaura, J.P. et al. "Temperature mapping of frozen tissue using Eddy current compensated half excitation RF pulses," Magn Reson Med 46:985-992 (2001).
Wehrli, F.W. and M.A. Fernandez-Seara, "Nuclear magnetic resonance studies of bone water," Annals of Biomed Engineering 33:79-86 (2005).
Wehrli, F.W. Et al., "Quantitative MRI for the assessment of bone structure and function," NMR in Biomed 19:731-764 (2006).
Ying K. et al., "Echo-time reduction for submillimeter resolution imaging with a 3D phase encode time reduced acquisition method," Magn Reson Med 33:82-87 (1995).
Yudilevich, E. and H. Stark, "Spiral sampling: theory and an application to magnetic resonance imaging," Journal of Optical Society of America A 5(4): 542-553 (Apr. 1988).
Zhu, H. et al., "High Temporal and Spatial Resolution 4D MRA Using Spiral Data Sampling and Sliding Window Reconstruction," Magn Reson Med 52: 14-18 (2004).
Burr, D.B., "Anatomy and physiology of the mineralized tissues: role in the pathogenesis of osteoarthrosis," Osteoarthritis and Cartilage 12: S20-30 (2004).
Bydder, G.M., "New Approaches to Magnetic Resonance Imaging of Intervertebral Discs, Tendons, Ligaments and Menisci," Spine 27(12):1264-1268 (2003).
Donohue, J.M. et al., "The effects of indirect blunt trauma on adult canine articular cartilage," J Bone Joint Surg Am 65-A: 948-957 (1983).

Dreher, W and D. Leibfritz, "A new method for fast proton spectroscopic imaging: spectroscopic Grease," Magn Reson Med 44:668-672 (2000).
Du, J.et al., "Imaging of the deep radial and calcified layers of the cartilage using ultrashort TE (UTE) sequence at 3T," In: Proceedings of the 15th Annual Meeting of ISMRM (International Society for Magnetic Resonance in Medicine), Berlin, Germany, 2007, p. 3809.
Duyn, J.H. and C.T.W. Moonen, "Fast proton spectroscopic imaging of human brain using multiple spin-echoes," Magn Reson Med 30: 409-414 (1993).
Erickson, S.J. et al., "Effect of tendon orientation on MR imaging signal intensity: a manifestation of the 'Magic Angle' phenomenon," Radiology 181:389-392 (1991).
Erickson, S.J. et al., The 'magic angle' effect: background physics and clinical relevance. Radiology 188:23-25 (1993).
Ferguson, V.L., et al., "Nanomechanical properties and mineral concentration in articular calcified cartilage and subchondral bone," J Anat 203:191-202 (2003).
Fullerton, G.D. et al., "Orientation of tendons in the magnetic field and its effect on T2 relaxation time," Radiology 155:433-435 (1985).
Fullerton, G.D. and A. Rahal, "Collagen structure: the molecular source of the tendon magic angle effect," J Magn Reson Imaging 25:345-361 (2007).
Gatehouse, P.D. et al. "Contrast-enhanced MRI of the menisci of the knee using ultrashort echo time (UTE) pulse sequences: imaging of the red and white zone," The British Journal of Radiology 77:641-647 (2004).
Goodwin, D.W. et al., "Micro-Imaging of Articular Cartilage: T2, Proton Density, and the Magic Angle Effect," Acad Radiology 5:790-798 (1998).
Guilfoyle, D.N. et al., PEEP—A Rapid Chemical Shift Imaging Method. Magn Reson Med 10:282-287 (1989).
Haase, A. and D. Matthaei, "Spectroscopic FLASH NMR imaging (SPLASH imaging)," J Magn Reson 71:550-553 (1987).
Henkelman, R.M. et al., "Anisotropy of NMR properties of Tissues," Magn Reson Med 32:592-601 (1994).
Hiba, B. et al., "Out-and-In Spiral Spectroscopic imaging in Rat Brain at 7 T," Magn Reson Med; 50:1127-1133 (2003).
Li, B. et al., "The electron miscroscope appearance of the subchondral bone plate in the human femoral head in osteoarthritis and osteoporosis," J Anat 195:101-110 (1999).
Martel-Pelletier, J., "Pathophysiology of osteoarthritis," Osteoarthritis Cartilage 12:S31-S33 (2004).
Muir, P et al., "Role of endochondral ossification of articular cartilage and functional adaptation of the subchondral plate in the development of fatigue microcracking of joints," Bone 38:342-349 (2006).
Park, H.W. et al., "Fast gradient-echo chemical-shift imaging," Magn Reson Med 7:340-345 (1988).
Pauly, J. et al., "Slice-Selective Excitation for Very Short $T_2$ Species," Proc. Society of Magnetic Resonance in Medicine, Book of Abstracts, vol. 1, Eight Annual Meeting and Exhibition, Aug. 12-18, 1989, Amsterdam, The Netherlands, 1989, P28.
Robson, M.D. et al., "Magnetic resonance imaging of the Achilles tendon using ultrashort TE (UTE) pulse sequences," Clinical Radiology 59: 727-735 (2004).
Rubenstein, J.D., et al., "Effects of collagen orientation on MR imaging characteristics of bovine articular cartilage," Radiology 188:219-226 (1993).
Song, H.K. et al., "Dynamic MRI with projection reconstruction and KWIC processing for simultaneous high spatial and temporal resolution," Magn Reson Med 52:815-824 (2004).
Squires, G.R. et al., "The pathobiology of focal lesion development in aging human articular cartilage and molecular matrix changes characteristic of osteoarthritis," Arthritis Rheum 48(5):1261-1270 (2003).
Xia, Y, et al., "Origin of cartilage laminae in MRI," J Magn Reson Imaging 7:887-894 (1997).

* cited by examiner

MAGNETIC RESONANCE IMAGING (MRI) USING ULTRA SHORT ECHO TIMES AND SPIRAL SAMPLING IN K-SPACE

CLAIM OF PRIORITY

This application claims priority under 35 USC §119(e) to U.S. Patent Application Ser. No. 60/792,010, filed on Apr. 13, 2006, the entire contents of which are incorporated by reference as part of the specification of this application.

TECHNICAL FIELD

This application relates to magnetic resonance imaging (MRI).

BACKGROUND

Imaging through MRI techniques is well known and has been widely applied in imaging applications in medical, biological and other fields. In essence, a typical MRI technique produces an image of a selected body part of an object under examination by manipulating the magnetic spins in a body part and processing measured responses from the magnetic spins. A MRI system may include hardware to generate different magnetic fields for imaging, including a static magnetic field along a z-direction to polarize the magnetic spins, gradient fields along mutually orthogonal x, y, or z directions to spatially select a body part for imaging, and an RF magnetic field to manipulate the spins.

SUMMARY

A methods, systems and computer program products of magnetic resonance imaging (MRI) using ultra short echo times and spiral sampling in k-space are disclosed.

In one aspect, magnetic resonance imaging (MRI) using ultra short echo times and spiral sampling in k-space is accomplished by applying to a sample, which exhibits long transverse relaxation time (T2) components and short T2 components, a long inversion radio frequency (RF) pulse that inverts magnetization of the long T2 components to minimize signals corresponding to the long T2 components. In addition, half RF excitation pulses are applied to the sample to select one or more echo times. Further, data corresponding to the selected one or more echo times are acquired using a spiral trajectory, and a first echo image is obtained based on the acquired data.

Implementations can optionally include one or more of the following features. A second echo image can also be obtained based on the acquired data. Also, a difference between the obtained first echo image and the second echo image can be determined to obtain imaging information corresponding to the short T2 components in the sample. Further, one or more additional echo images can be obtained based on the acquired data. To minimize gradient error and eddy current effect, one or more compensation gradients can be implemented. Also, a hysteresis gradient can be implemented to generate a consistent sinusoidal K-space offset for each spiral interleaf in the spiral trajectory.

In another aspect, magnetic resonance imaging (MRI) using ultra short echo times and spiral sampling in k-space is performed by obtaining a first image from a sample using various processes including applying to the sample a slice-selective long duration adiabatic inversion radio frequency (RF) pulse and a first slice-selective magnetic field gradient of a first polarity to invert magnetization of long transverse relaxation time (T2) components in the sample. After a time delay (TI) sufficient for the magnetization of the inverted long T2 components to reach a null point, a half RF excitation pulse and a second slice-selective magnetic field gradient of the first polarity are applied to the sample. Then after applying the half RF excitation pulse and the second slice-selective magnetic field gradient of the first polarity, magnetic readout gradients are applied along two orthogonal directions according to a predetermined spiral trajectory in the k-space to obtain a first echo data and a subsequent second echo data from the sample.

Next, a second image is obtained from the sample by performing various processes including applying to the sample the slice-selective inversion RF pulse and the first slice-selective magnetic field gradient of the first polarity to invert magnetization of long T2 components in the sample. After the time delay (TI) sufficient for the magnetization of the inverted long T2 components to reach the null point, the half RF excitation pulse and a second slice-selective gradient of a second polarity and reverse of the first polarity are applied to the sample. Then after applying the half RF excitation pulse and the second slice-selective magnetic field gradient of the second polarity, the magnetic readout gradients are applied along the two orthogonal directions according to the predetermined spiral trajectory in the k-space to obtain a first echo data and a subsequent second echo data from the sample.

A slice profile is also obtained by adding (1) the obtained first echo data for the first image and the obtained first echo data for the second image to produce a final first echo image, and (2) the obtained second echo data for the first image and the obtained second echo data for the second image to produce a final second echo image. Then using a difference between the final first echo image and the final second echo image, imaging information corresponding to short T2 components in the sample are obtained.

In yet another aspect, magnetic resonance imaging (MRI) using ultra short echo times and spiral sampling in k-space is implemented by first obtaining a first image of a sample by performing various processes including applying a non-selective inversion radio frequency (RF) pulse to invert magnetization of all components including a signal from flowing blood in the sample. After applying the non-selective inversion FR pulse, a slice-selective inversion recovery RF pulse and a first slice-selective gradient of a first polarity are applied to restore the magnetization of components in an imaging slice of interest. Then after a time delay (TI) sufficient for the magnetization of the inverted signal from blood flowing into the imaging slice to reach a null point, a half RF excitation pulse and a second slice-selective gradient of the first polarity are applied to the sample. Then after applying the half RF excitation pulse and the second slice-selective gradient of the first polarity, magnetic readout gradients are applied along two orthogonal directions according to a predetermined spiral trajectory in the k-space to obtain a first echo data from the sample.

Next, a second image is obtained form the sample by performing various processes including applying the non-selective inversion RF pulse to the sample to invert magnetization of all components including a signal from flowing blood in the sample. After applying the non-selective inversion RF pulse, the slice-selective inversion recovery RF pulse and the first slice-selective gradient of the first polarity are applied to restore the magnetization of components in the imaging slice of interest Then after a time delay (TI) necessary for the magnetization of the inverted signal from blood flowing into the imaging slice to reach the null point, the half RF excitation pulse and the second slice-selective gradient of the second polarity are applied to the sample, After applying the half RF excitation pulse and the second slice-selective gradient of the second polarity, the magnetic readout gradients are applied along the two orthogonal directions according to the predetermined spiral trajectory in the k-space to obtain a second echo data from the sample. The first echo data and the second echo data are added to obtain a final echo data, and an image reconstruction is performed on the obtained final echo data to obtain imaging information including both short T2 and long T2 components in the sample.

This black blood imaging technique can also be extended to a dual echo acquisition, where the dual echo images are obtained by adding (1) the obtained first echo data for the first image and the obtained first echo data for the second image to produce a final first echo image, and (2) the obtained second echo data for the first image and the obtained second echo data for the second image to produce a final second echo image. Then using a difference between the final first echo image and the final second echo image, imaging information corresponding to short T2 components in the sample are obtained.

The subject matter described in this specification can be implemented as a method or as a system or using computer program products, tangibly embodied in information carriers, such as a CD-ROM, a DVD-ROM, a semiconductor memory, and a hard disk. Such computer program products may cause a data processing apparatus to conduct one or more operations described in this specification.

In addition, the subject matter described in this specification can also be implemented as a system including a processor and a memory coupled to the processor. The memory may encode one or more programs that cause the processor to perform one or more of the method acts described in this specification. Further the subject matter described in this specification can be implemented using various MRI machines.

BRIEF DESCRIPTION OF THE DRAWINGS

Like reference symbols and designations in the various drawings indicate like elements.

DETAILED DESCRIPTION

Figure 1:
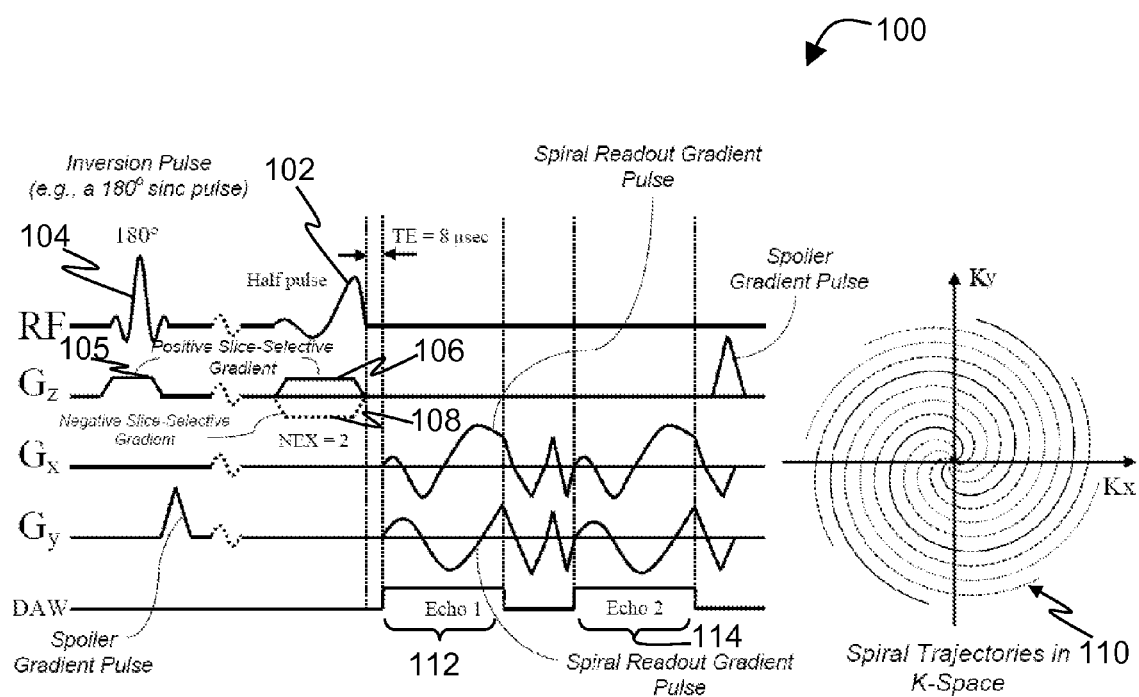
FIG. 1 is an illustration of a pulse sequence used in Magnetic Resonance Imaging (MRI).

Human bodies and other animal bodies include tissues which have such short T2 relaxation times that are difficult to detect when imaged with various clinical magnetic resonance imaging pulse sequences. Examples of ultrashort T2 tissues include cortical bone, tendons, ligaments, menisci, and periosteum. Many tissues like the brain white matter contain a fraction of ultrashort T2 components. After excitation the MR signal from these tissues decays very rapidly so that the signal magnitude is zero or close to zero by the time the receive mode of the clinical MR system is enabled. As a result, tissues with such ultrashort T2 appear as signal voids in MR images. To detect these tissues, various MRI techniques are implemented to switch rapidly from the transmit mode to the receive mode and use pulse sequences designed to detect and spatial encode rapidly decaying signals before they have disappeared.

Pulse sequences with short echo times (TEs) in the order of 100 μsec or less can be produced by use of half radio-frequency (RF) excitations with radial mapping from the center of k-space. Use of projection reconstruction (PR) acquisition gradients allows immediate data collection without the time delays associated with phase encoding gradients. John Pauly et al. at Stanford first developed an ultrashort echo time (UTE) sequence in 1991 for lung parenchyma imaging, and later for cartilage, mensisci and angiography. In 2002, Peter Gatehouse et al. implemented the half pulse excitation UTE sequence on a Siemens system and achieved a short echo time of 80 μsec. Good signal to noise ratio (SNR) and image contrast have been achieved for cortical bone, periosteum, menisci, cartilage, and the short T2 components in brain white matter.

One of the potential limitations of the 2D UTE sequence is relatively long scan times, owing in part to the combination of acquisition methods needed to sample the rapidly decaying signal, as well as the time inefficiency of needing two half-pulse acquisitions. UTE is commonly implemented with the radial sampling trajectory, which is well-known to be inefficient in covering k-space compared to rectilinear and spiral trajectories. There are sound theoretical reasons for using the radial trajectory since it reaches the furthest distance from the center of k-space in a given time and therefore allows the rapidly decaying MR signal to be sampled at higher spatial frequencies than with other trajectories. In addition, a high sampling bandwidth for the data acquisition is needed to capture the signal before it decays to zero. Simulations and phantom images confirm that fast radial sampling results in better SNR and higher spatial resolution in structures with extremely short T2s. However, in practice, the combination of a short readout and high bandwidth tends to produce images that suffer from poor SNR and so that many averages may be required to obtain acceptable images.

Many of the proposed clinical applications have been obtained with much lower sampling rates than the maximum; for example, from 4 to 32 μs per readout point (i.e. 125 to 15.63 kHz bandwidth). The fact that acceptable images are obtainable at these low bandwidths indicates that the signals currently of interest might be accessible with less than the fastest data acquisition strategies. Indeed, T2 values for tissues visible by the UTE sequence have been in the range 500 μs to 10 ms which permit some leeway in optimizing the sequences for SNR and contrast. In these cases it may be feasible to substitute the radial trajectory, which is optimally suited for sampling rapidly decaying signals, with a trajectory that covers k-space more slowly yet more time-efficiently. One time-efficient trajectory is a spiral trajectory described as an example below and illustrated in FIG. 1.

FIG. 1 illustrates one implementation of a pulse sequence for one repetition time (TR) which combines one half pulse excitation 102 and spiral sampling to provide ultrashort TE (UTE, e.g., TE=8 μsec) imaging of species with ultrashort T2 times. Such image signals can be difficult to detect using various clinical magnetic resonance imaging sequences. The half pulse excitation 102 allows data sampling at an ultrashort echo time of being on the order of magnitude in micro seconds, e.g., 8 μsec. The spiral sampling allows a relatively long data sampling duration, thus providing higher signal-to-noise ratio (SNR) efficiency than radial sampling. A long inversion pulse 104 is used to null the long T2 signals while preserving the short T2 signals. The long T2 signals are further suppressed through the subtraction of a later echo image with TE≧5 msec from an early echo image with TE=8 μsec.

An UTE sequence typically uses an inversion pulse 104 to suppress long T2 signals. The repetition time TR is long in order to gain high contrast and SNR. Radial trajectories are undersampled to shorten the scan time at the expense of reduced SNR and streak artifact. The long scan time, low signal to noise ratio, and undersampling streak artifact can limit the clinical application of radial UTE sequence. The spiral UTE sequence illustrated in FIG. 1 can be implemented to mitigate limitations in the radial UTE sequence. A spiral trajectory has a higher duty cycle, thus higher SNR efficiency and less streak artifact than radial trajectory.

The example in FIG. 1 includes three parts:

(1) A long slice selective adiabatic fast passage (Silver-Hoult) inversion pulse 104 is used to invert the long T2 magnetization. The image acquisition begins after a time delay (TI) sufficiently long for the magnetization of inverted long T2 components to reach the null point;

(2) Two radio frequency (RF) "half" pulses 102 are used for slice selection. A complete slice profile is generated by collecting data with the slice selection gradient in one direction 106 and adding this to data collected with the slice selection gradient reversed 108.

(3) A spiral trajectory 110 is used for data acquisition. The trajectory is generated numerically by, e.g., using a $4^{th}$ order Runge-Kutta method. A dual-echo acquisition is implemented with an echo time of, e.g., 8 μsec, for the first echo 112 and a longer time of e.g., 5~15 msec, for the second echo 114. Gradient compensation is added to the rewinder gradient between the two echoes 112 and 114 to minimize gradient error and eddy current effect. Hysteresis gradient is also added between the two echoes to generate a consistent, rather than a sinusoidal k-space offset for each spiral interleaf, which can be corrected through gradient compensation or echo shifting during image reconstruction.

Notably, the spiral UTE imaging of the ultrashort T2 species requires suppression of long T2 signals, which typically have much higher signal intensity than the short T2 components because long T2 tissues typically have higher proton density than short T2 tissues. The long inversion pulse and dual-echo echo subtraction can be used to significantly suppress the long T2 signals. The high SNR efficiency of spiral trajectory allows high SNR and streak artifact free images of the short T2 species, and thus provide considerable potential for clinical imaging of short T2 tissues.

Figure 2A:
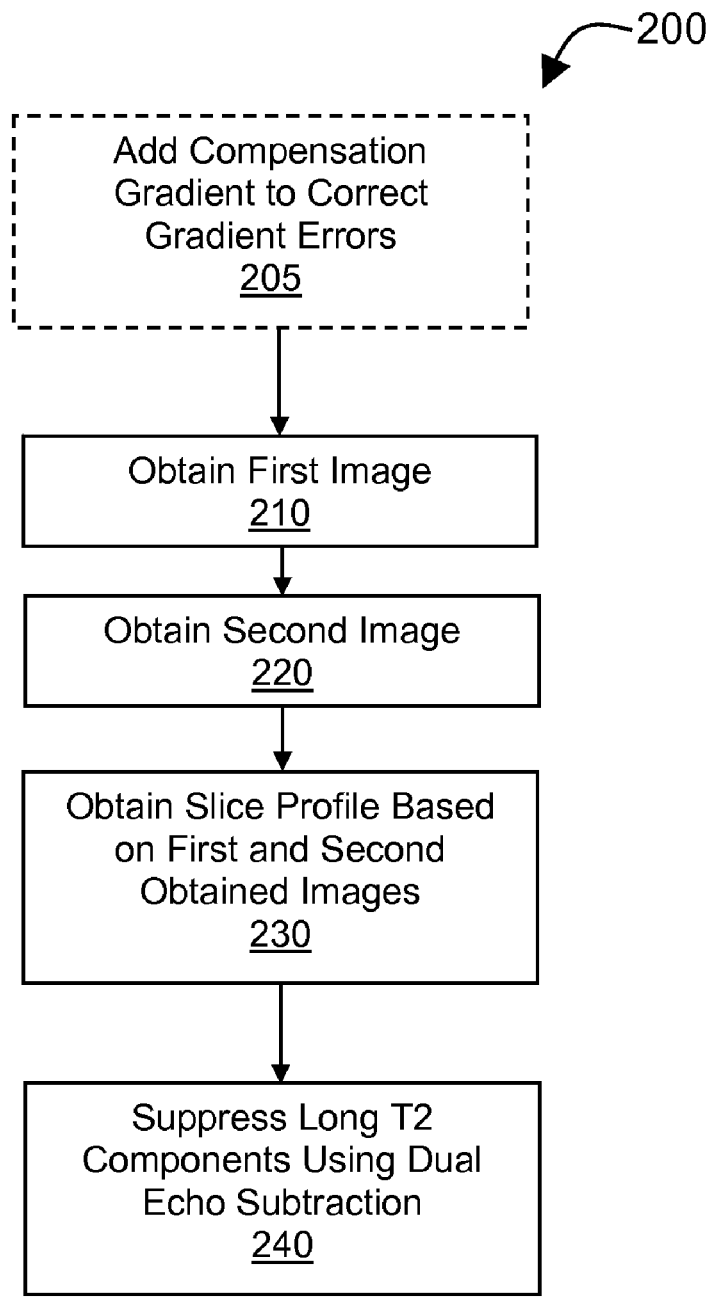
FIGS. 2A, 2B and 2C illustrate a process flow diagram of a method for obtaining MRI measurements with short T2 times.
Figure 2B:
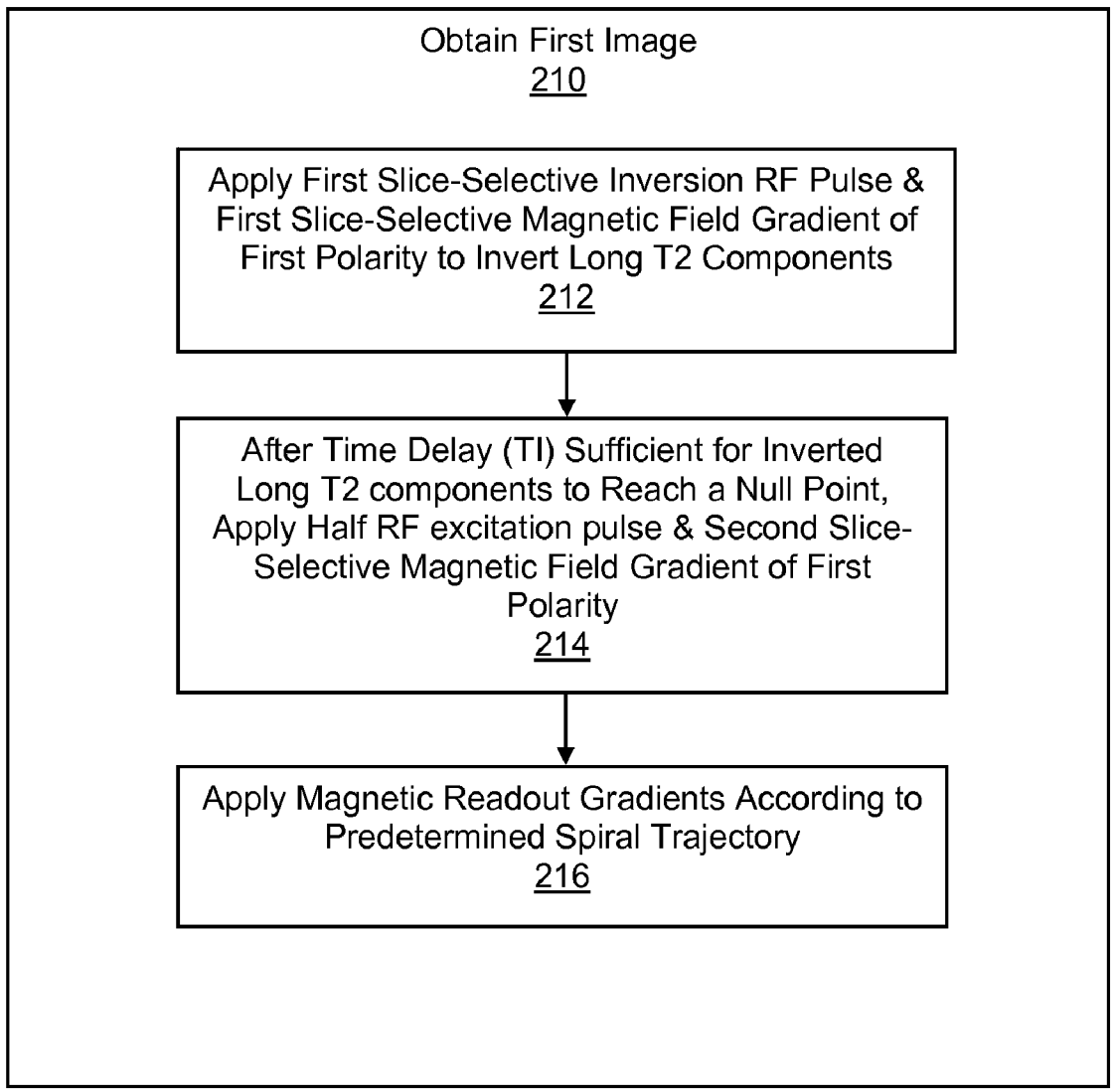
Figure 2C:
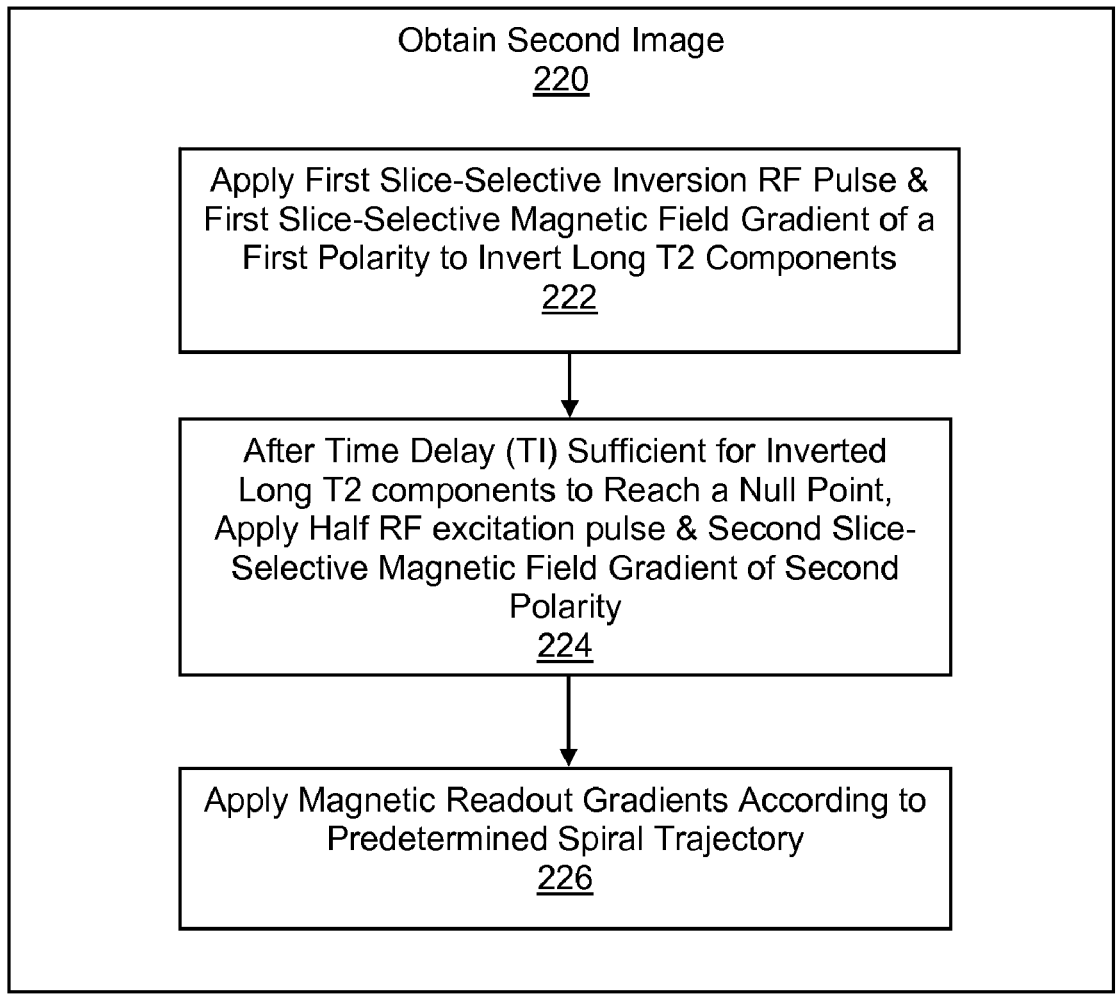

FIGS. 2A, 2B and 2C are process flow diagrams that illustrate an example of a method 200 for obtaining MRI measurements with short T2 times. Long T2 components in a sample is suppressed using an inversion RF pulse and dual (or multiple) echo subtraction. As shown in FIG. 2A, this method 200 includes obtaining a first image at 210; obtaining a second image at 220; obtaining a slice profile based on the obtained first and second images at 230; and suppressing long T2 components by using dual echo subtraction at 240. The method 200 can optionally include adding one or more compensation gradients at 205 to correct gradient errors. The compensation gradient is added before obtaining the first and second images.

FIG. 2B shows the various operations that can be used to obtain the first image at 210. A slice-selective inversion RF pulse 104 and a first slice selective magnetic field gradient of a first polarity (e.g., positive or negative) 105 are applied to a sample having short T2 tissues (components) and long T2 tissues at 212 to invert magnetization of components in the sample with the long T2 time. The slice-selective inversion RF pulse includes a slice-selective long duration adiabatic inversion RF pulse. After a time delay (TI) sufficient for the magnetization of the inverted long T2 components to reach a null point, a half RF excitation pulse 102 and a second slice-selective magnetic field gradient of the first polarity 108 are applied at 214. After applying the half RF excitation pulse 102 and the second slice-selective magnetic field gradient of the first polarity 108, magnetic readout gradients are applied, at 216, along two orthogonal directions according to a predetermined spiral trajectory in the k-space to obtain a first echo data and a subsequent second echo data from the sample.

This method 200 also includes obtaining a second image at 220 by performing functions similar to those used to obtain the first image. FIG. 2C shows the process of obtaining the second time, the slice-selective inversion RF pulse 104 and the first slice-selective magnetic field gradient of the first polarity 105 are applied to the sample at 222 to invert magnetization of the long T2 components in the sample. After a time delay (TI) sufficient for the magnetization of the inverted long T2 components to reach the null point, the half RF excitation pulse 102 and a second slice-selective gradient of a second polarity 108 (and reverse of the first polarity) are applying to the sample at 224. After applying the half RF excitation pulse and the second slice-selective magnetic field gradient of the second polarity, the magnetic readout gradients are applied along the two orthogonal directions, at 226, based on the predetermined spiral trajectory in the k-space to obtain a first echo data and a subsequent second echo data from the sample for the second image.

A slice profile is obtained at 230 using the obtained first and second images. The obtained first echo data for the first image and the obtained first echo data for the second image are added to produce a final first echo image. Similarly, the obtained second echo data for the first image and the obtained second echo data for the second image are added to produce a final second echo image. To further suppress the long T2 components, dual echo subtraction is used at 240. The difference between the final first echo image and the final second echo image is used to obtain imaging information (e.g., magnetization or spins) corresponding to short T2 components in the sample.

The example of the present technique described above can be used for multi-echo spiral UTE acquisition (e.g., up to 12 echoes). The multi-echo images have several applications. In particular, multi-echo images can be used for T2 quantification of tissues (samples) with short relaxation time, such as calcified layer cartilage, meniscus, tendon, ligaments, etc. Also, the multi-echo images can be used to generate a subtraction image with improved signal-to-noise ratio (SNR) over the dual echo spiral UTE acquisition. This improved SNR can be achieved through subtraction of the first image from an averaged image (e.g., from later echoes), or linear combination filtering where the addition of properly weighted multi-echo images results in effective suppression of long T2 signals with less noise enhancement.

The spiral trajectory can be susceptible to gradient errors (e.g., gradient anisotropy, gradient distortion and gradient digitization error) and eddy currents, especially for later echoes in multi-echo spiral acquisition. These errors can optionally be compensated or corrected by adding compensation gradients in the rewinder gradient, at 250, so that the magnetization spins are fully refocused at the beginning of data acquisitions for later echoes.

Figure 3:
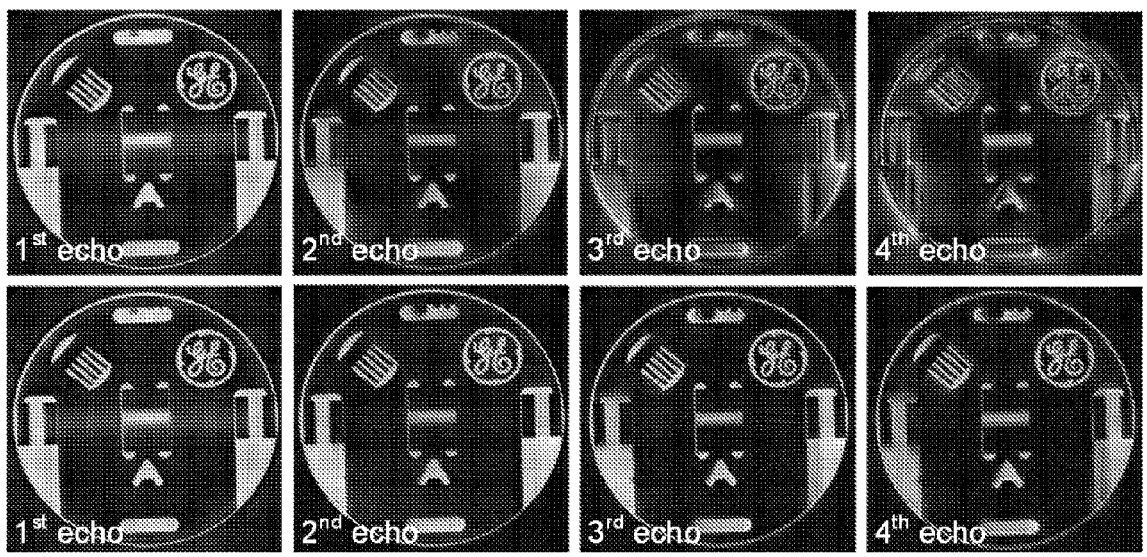
FIG. 3 illustrates example images before using gradient compensation (top row) and after using gradient compensation (bottom row).

Phantom studies shown in FIG. 3 demonstrate this effect. FIG. 3 illustrates a sequence of multiecho spiral UTE images. The upper row illustrates images associated with the first echo, second echo, third echo and forth echo without applying the gradient compensation for gradient error and eddy currents. The bottom row in FIG. 3 illustrates images associated with the first through the fourth echo after application of the gradient compensation for gradient error and eddy currents. It is evident that the quality of each of the images associated with the second through fourth echoes is improved after gradient compensation, whereas the quality of each of the images associated with the second through fourth echoes is progressively deteriorated without the application of gradient compensation. Eddy current correction using k-space trajectory measurement and the static magnetic field B0 field map correction may further improve the image quality.

Figure 4:
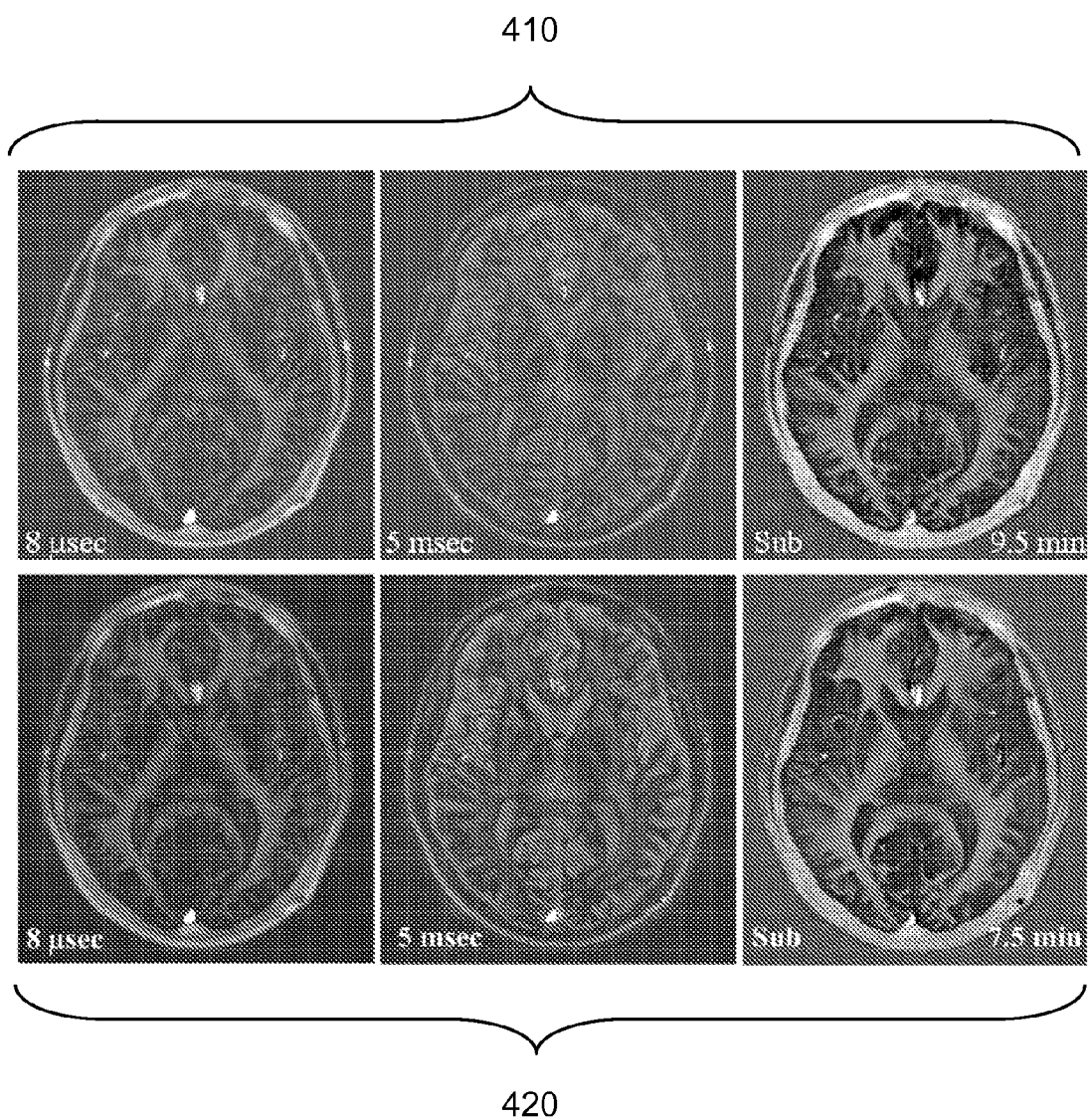
FIG. 4 illustrates a comparison between spiral UTE imaging (bottom row) and radial UTE imaging (top row).
Figure 5:
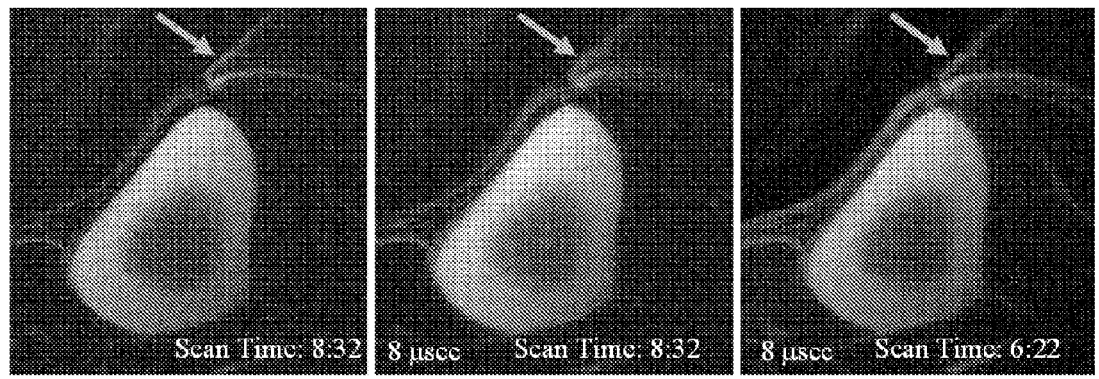
FIG. 5 illustrates ultrashort T2 imaging of cortical bone using radial UTE (first two panels from left) and spiral UTE (right most panel).

The example of the present technique described above can also be used for single slice spiral UTE imaging. A sample set of spiral UTE brain white matter images 420 and their comparison with radial UTE images 410 are shown in FIG. 4. The acquisition parameters for radial and spiral UTE are: FOV=26 cm, readout=192/256, BW=31.25 kHz, slice thickness=5 mm, pixel size=1.35/1.30 mm, TR=1500 ms, TI=380 ms, scan time=9.5/7.5 min. Spiral UTE provides significantly higher SNR and less streak artifact in a shorter scan time than radial UTE. SNR efficiency, defined as the measured SNR divided by the square root of scan time, was increased from 0.08 for radial UTE to 0.21 for spiral UTE. Furthermore, the strong streak artifact in the radial UTE image 410 is significantly suppressed in the spiral UTE image 420. The techniques were also tested on cortical bone imaging. The initial results are show in FIG. 5. The acquisition parameters for radial and spiral UTE are: FOV=12/10 cm, readout=512, BW=62.5 kHz, slice thickness=6 mm, pixel size=0.23 mm, TR=500 ms, TI=200 ms, scan time=8.5/6.4 min. Again, spiral UTE provides a significantly higher SNR efficiency (78% higher) than that of the radial UTE.

Based on the single slice spiral UTE sequence, a multislice spiral UTE sequence was implemented in MRI imaging tests. In the tests, inversion pulses were applied sequentially to 10 to 20 slices followed by data acquisition of these slices sequentially.

Figure 6:
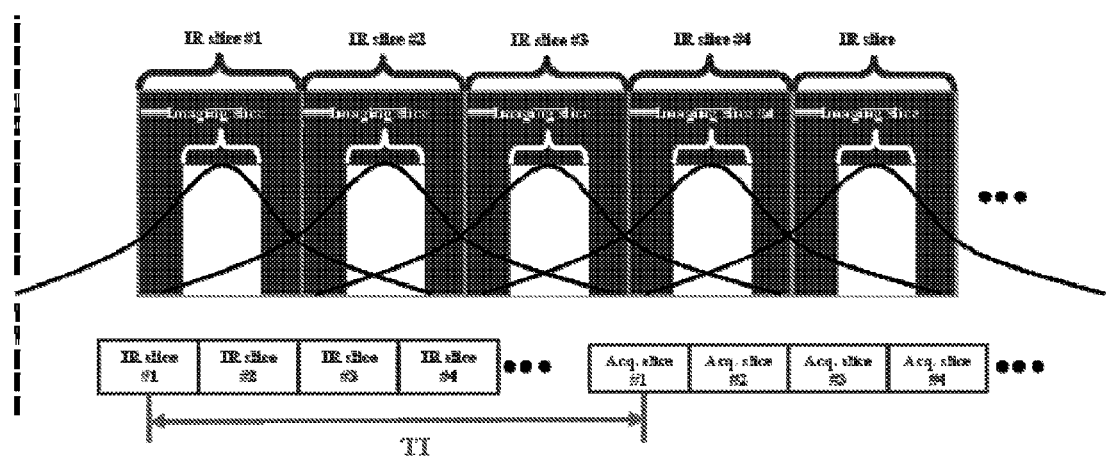
FIG. 6 is a diagram for multislice spiral UTE sequence.

FIG. 6 shows a graphical display of the multislice spiral UTE acquisition.

Figure 7:
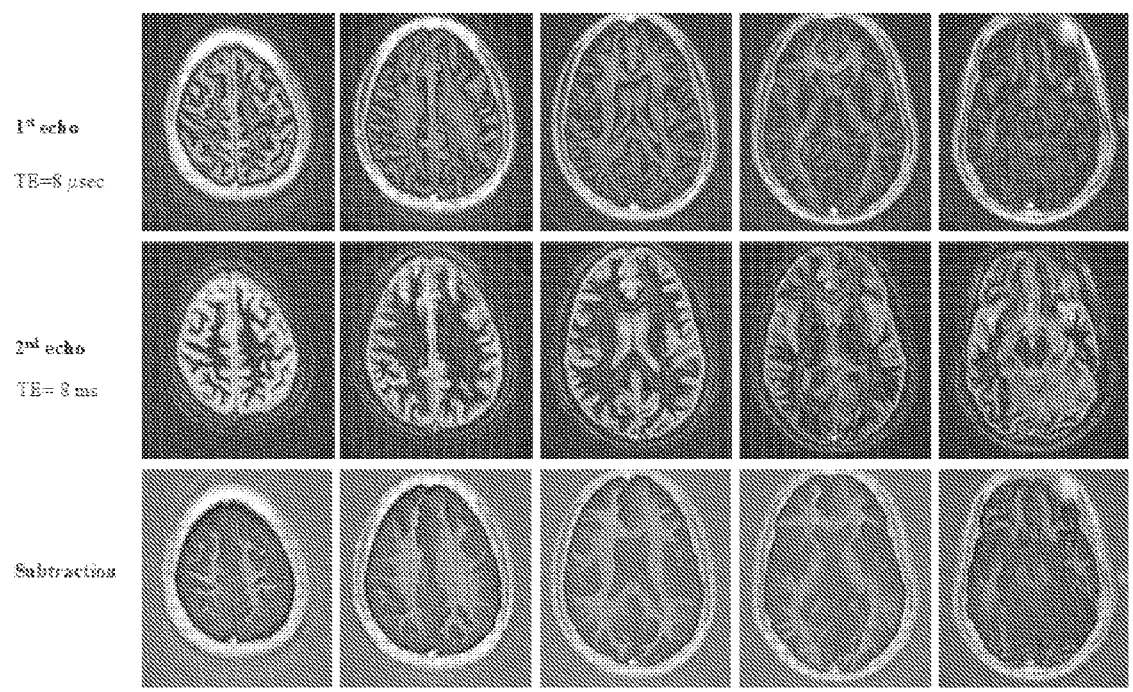
FIG. 7 shows sample images obtained using a multislice spiral UTE sequence.

FIG. 7 shows sample images obtained using a multislice spiral UTE sequence, where a slice gap of 200% was used for better suppression of the long T2 out-of-slice signal contamination, which is due to the broadened slice profile from half pulse excitation. The acquisition parameters are: FOV=22 cm, readout=256, 71 spiral interleaves, BW=31.25 kHz, slice thickness=5 mm, pixel size=1.5 mm, TR=1500 ms, TE=8 µs and 8.5 ms, TI=360 ms, total scan time=3.5 min. The first (top) row shows a set of first echo images (at TE=8 µs), and the second (middle) row shows a set of second echo images (at 8.5 ms). The third (bottom) row shows the result of subtracting the two sets of echo images.

Figure 8:
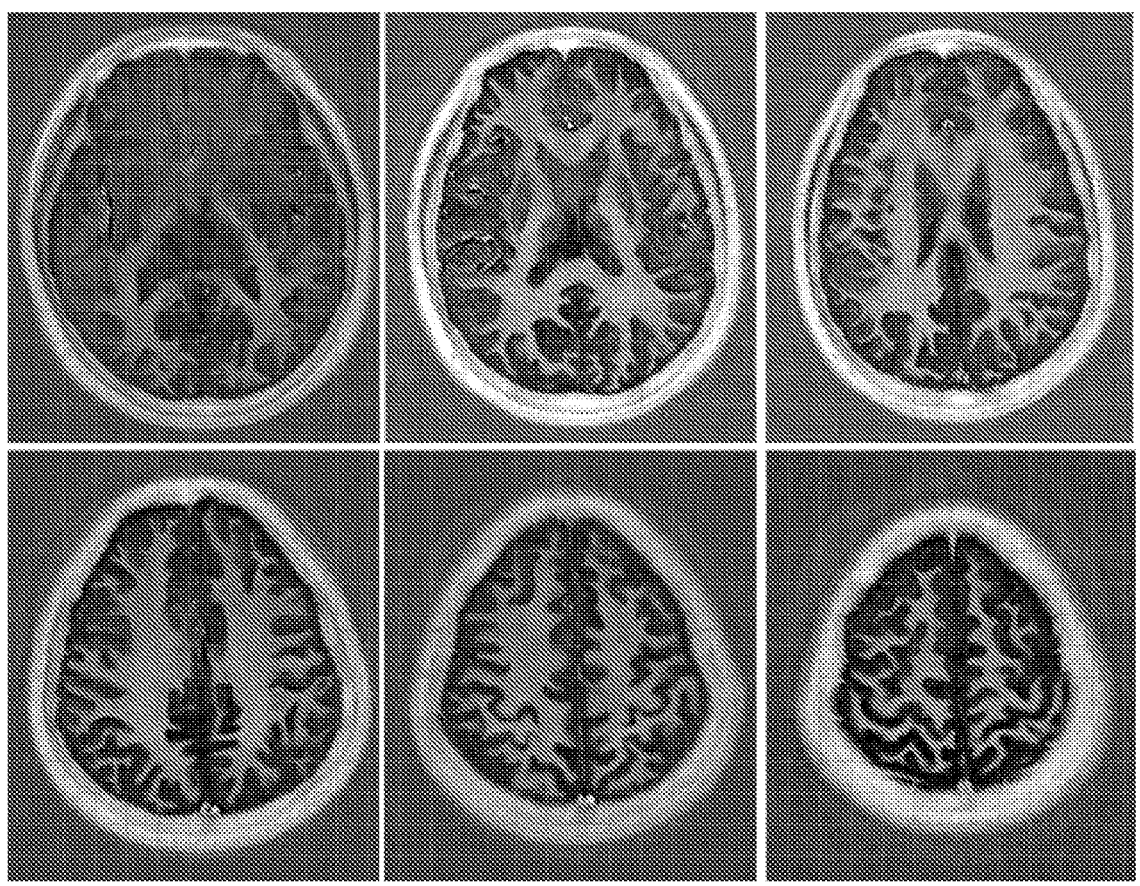
FIG. 8 illustrates multislice spiral UTE imaging of ultrashort T2 components in brain white matter.

FIG. 8 shows another set of sample images obtained using the multislice spiral UTE sequence, where 191 spiral interleaves were used to reduce the pixel size to 1.35 mm in a total scan time of 7.5 min.

In some implementations, the spiral UTE sequence can be combined with a double inversion recovery sequence to suppress signals from the flowing blood (e.g., long T2 signals), thus depicting the arterial vessel wall/plaque with excellent contrast and high SNR through proton density weighted imaging. Dual echo double inversion recovery (DIR) Spiral UTE is also developed to selectively depict the vessel wall and short T2 components. In comparison with other gradient echo black blood imaging techniques, the DIR Spiral UTE sequence described here allows much shorter TE, thus higher SNR for the vessel wall which has relatively short T2 components.

Figure 9:
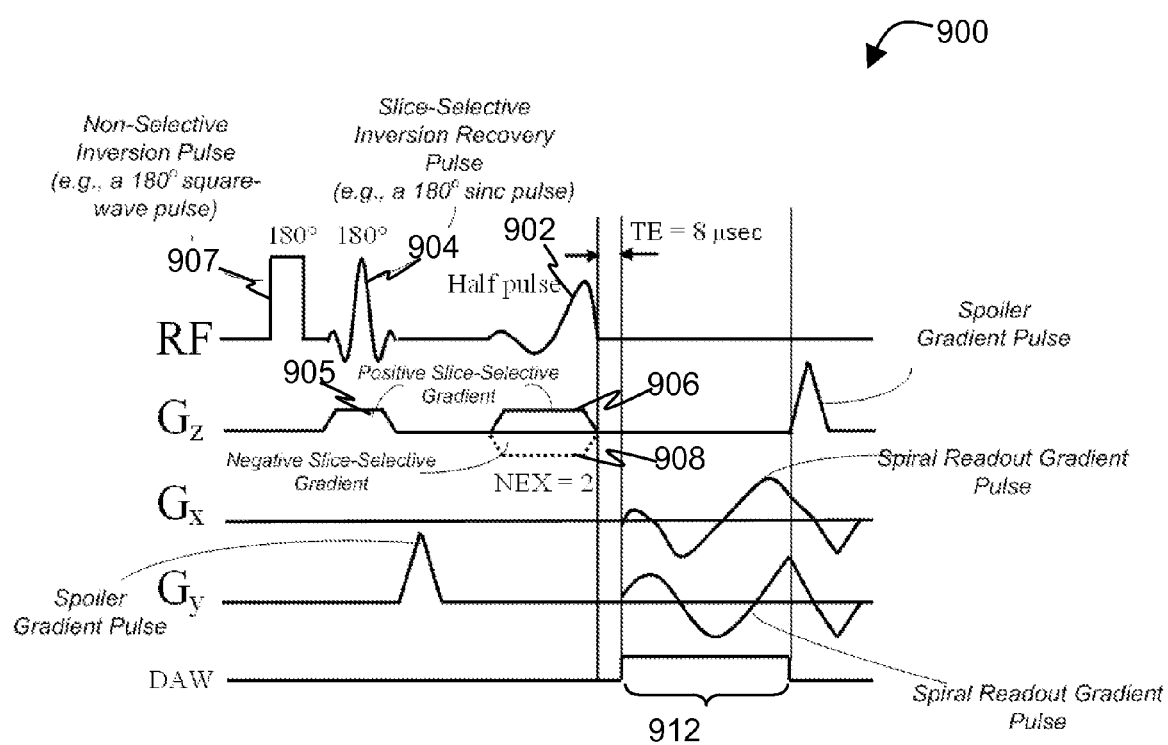
FIG. 9 is an illustration of a double inversion pulse sequence for a DIR-UTE with a single echo.
Figure 10:
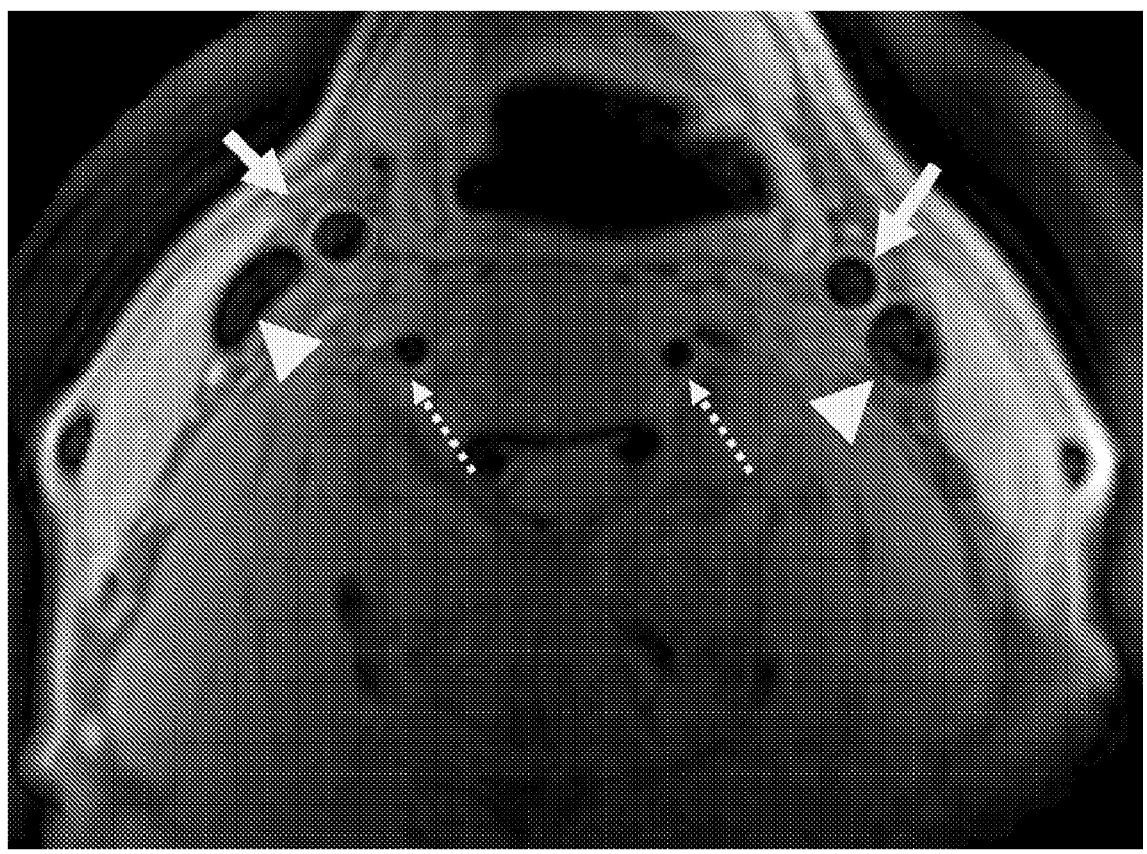
FIG. 10 is a sample image obtained using a DIR-UTE sequence.

FIG. 9 shows an example of a double inversion pulse sequence 900 for DIR-UTE. The pulse sequence 900 includes a non-selective inversion pulse 907, a slice-selective inversion recovery (IR) pulse 904, a half RF excitation pulse 902, a first slice-selective magnetic field gradient of a first polarity 905, a second slice-selective magnetic field gradient of the first polarity and a second slice-selective magnetic field gradient of a second polarity 908. A single echo 912 is used to acquire data based on spiral readout gradients. A sample image obtained using the DIR-UTE sequence is shown in FIG. 10.

Figure 11A:
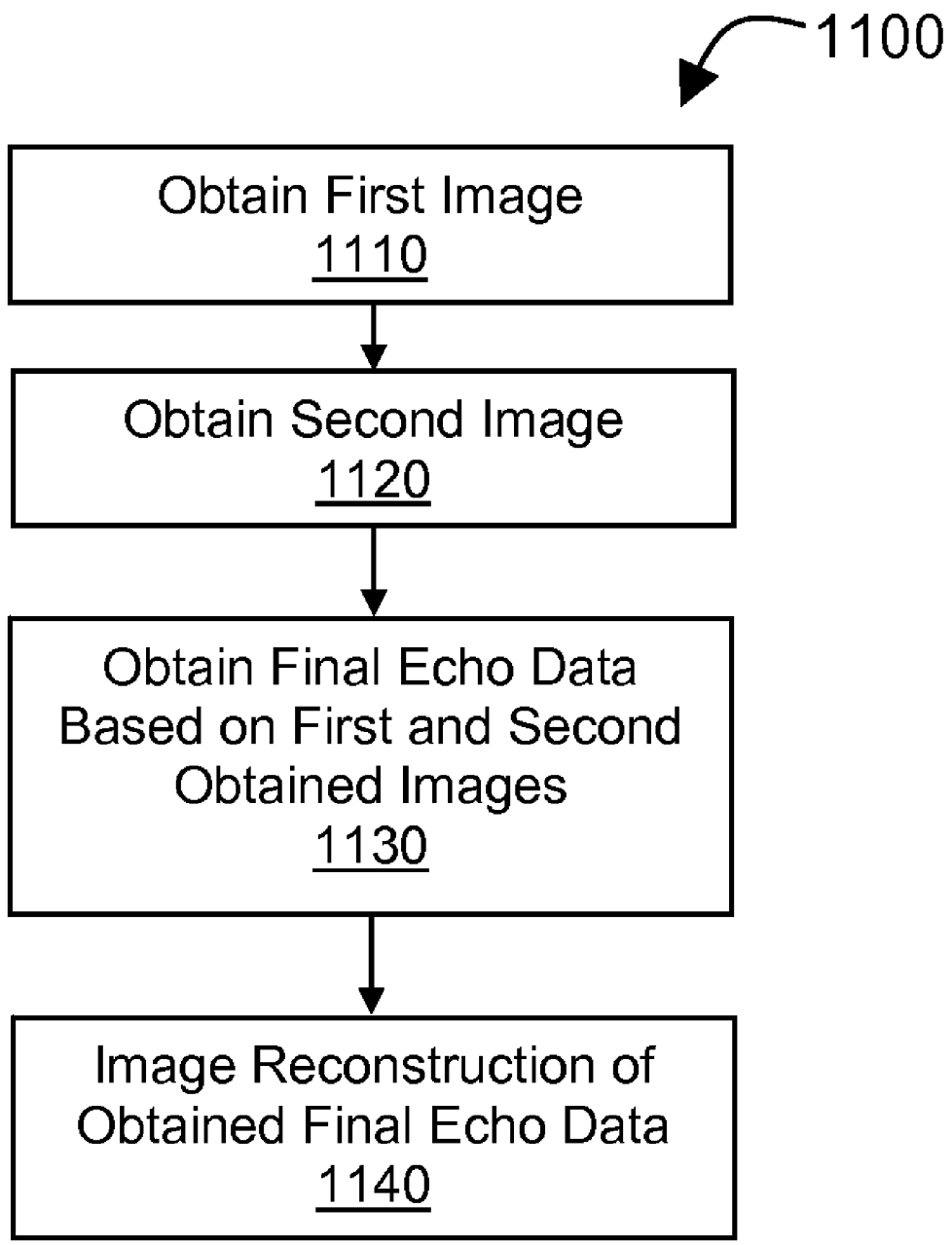
FIGS. 11A, 11B and 11C illustrate a process flow diagram of a method for obtaining MRI measurements using double inversion recovery.
Figure 11B:
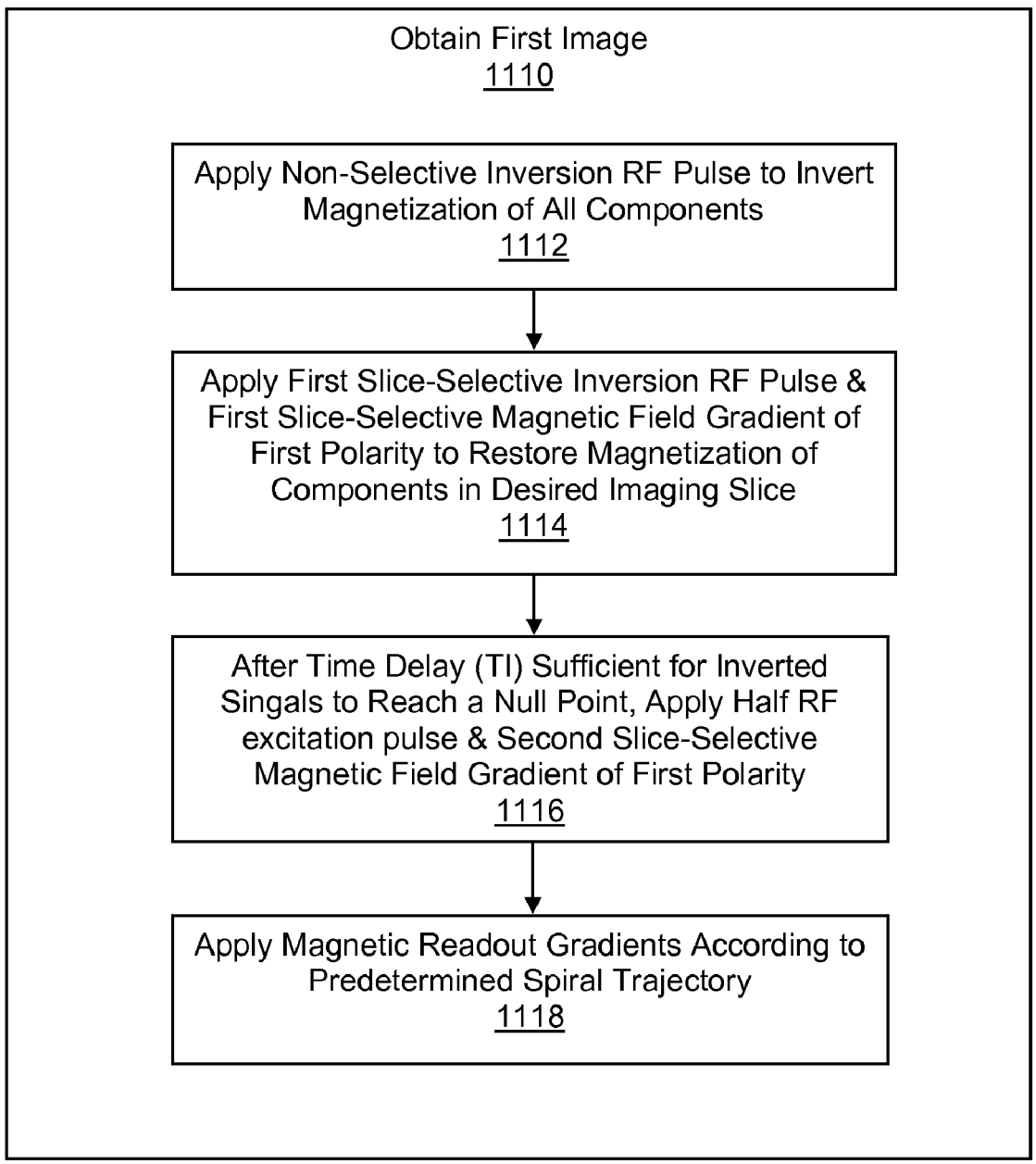
Figure 11C:
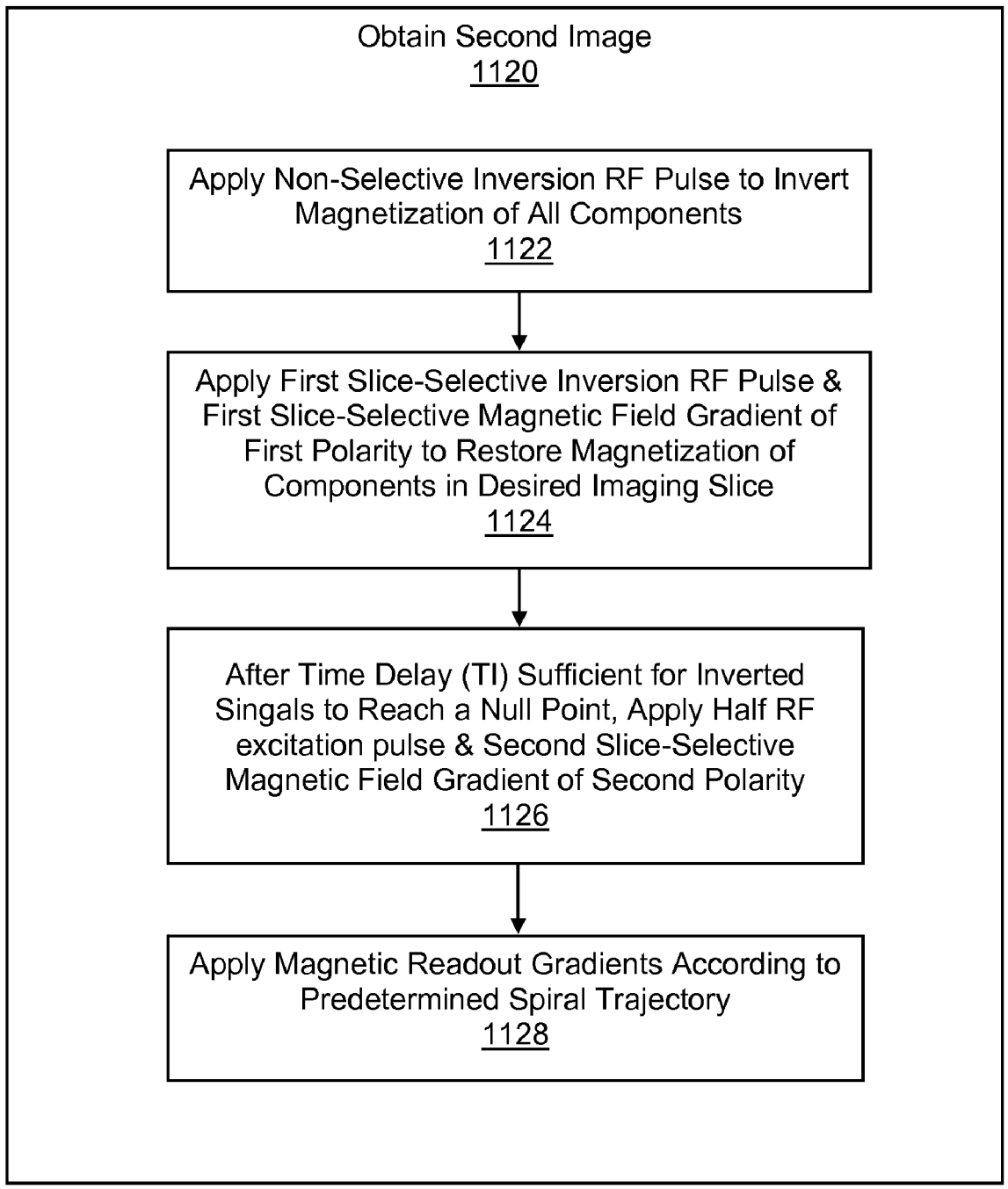

FIG. 11 is a process flow diagram illustrating an example of a method 1100 for obtaining MRI measurements using double inversion recovery. This method 1100 includes obtaining a first image at 1110 by performing various functions at 1110. A non-selective inversion RF pulse is applied to a sample to invert magnetization of all components including a signal from flowing blood in the sample at 1112. After applying the non-selective inversion RF pulse, a slice-selective inversion recovery RF pulse and a first slice-selective magnetic field gradient of a first polarity are applied to the sample at 1114 to restore the magnetization of components in a desired imaging slice of interest. After a time delay (TI) necessary for the magnetization of the inverted signal from blood flowing into the imaging slice to reach a null point, a half RF excitation pulse and a second slice-select gradient of the first polarity are applied to the sample at 1116. After applying the half RF excitation pulse and the second slice-selective gradient of the first polarity, magnetic readout gradients are applied along two orthogonal directions based on a predetermined spiral trajectory in the k-space to obtain a first echo data from the sample at 1018.

This method 1100 also includes obtaining a second image at 1120 using functions similar to those applied with respect to the first image. For the second time, the non-selective inversion RF pulse is applied to the sample at 1122 to invert spins of all components including a signal from flowing blood in the sample. After applying the non-selective inversion RF pulse, the slice-selective inversion recovery RF pulse and the first slice-selective magnetic field gradient of the first polarity are applied to the sample at 1124 to restore the magnetization of components in the imaging slice of interest. After the time delay (TI) necessary for the magnetization of the inverted signal from blood flowing into the imaging slice to reach the null point, the half RF excitation pulse and the second slice-selective magnetic field gradient of the second polarity are applied to the sample at 1126. After applying the half RF excitation pulse and the second slice-selective magnetic field gradient of the second polarity, the magnetic readout gradients are applied along the two orthogonal directions according to the predetermined spiral trajectory in the k-space to obtain a second echo data from the sample at 1128.

The first echo data and the second echo data are then added to obtain a final echo data at 1130. The final echo data is then subject to image reconstruction to provide imaging information corresponding to short T2 components in the sample at 1140.

Figure 12:
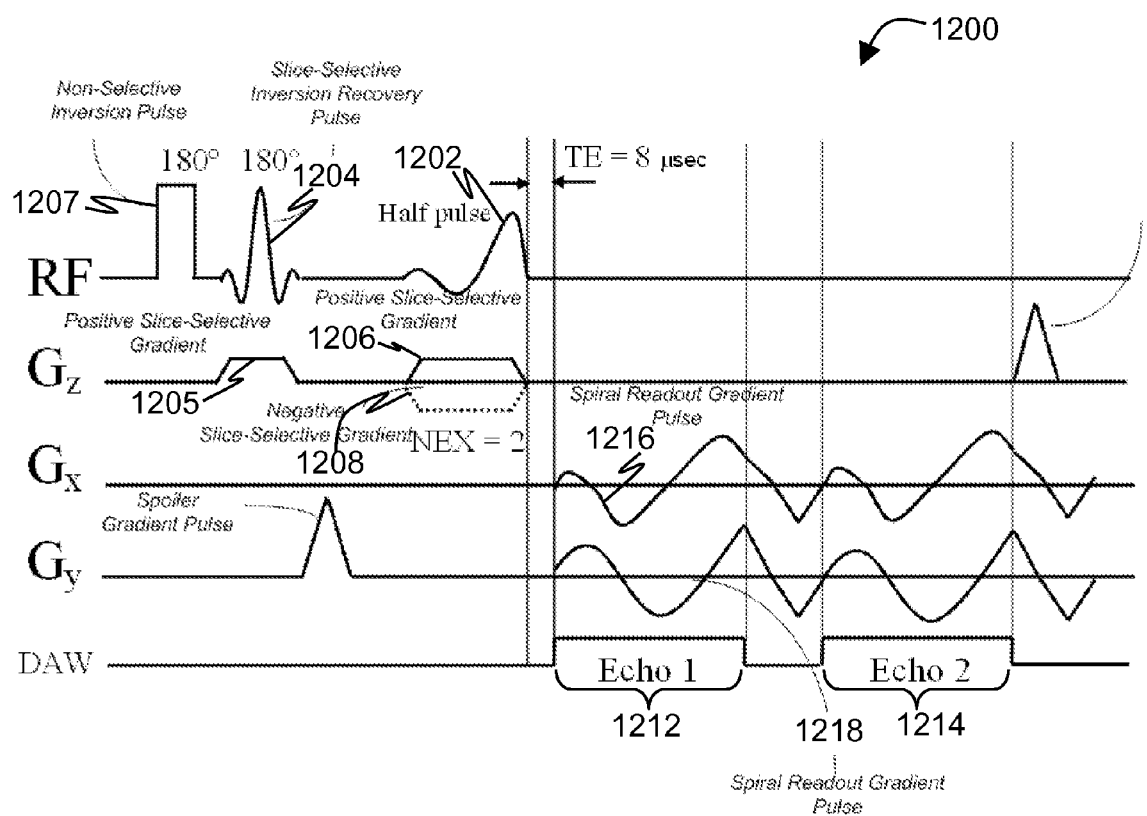
FIG. 12 is an illustration of a double inversion pulse sequence for a DIR-UTE with dual echos.
Figure 13:
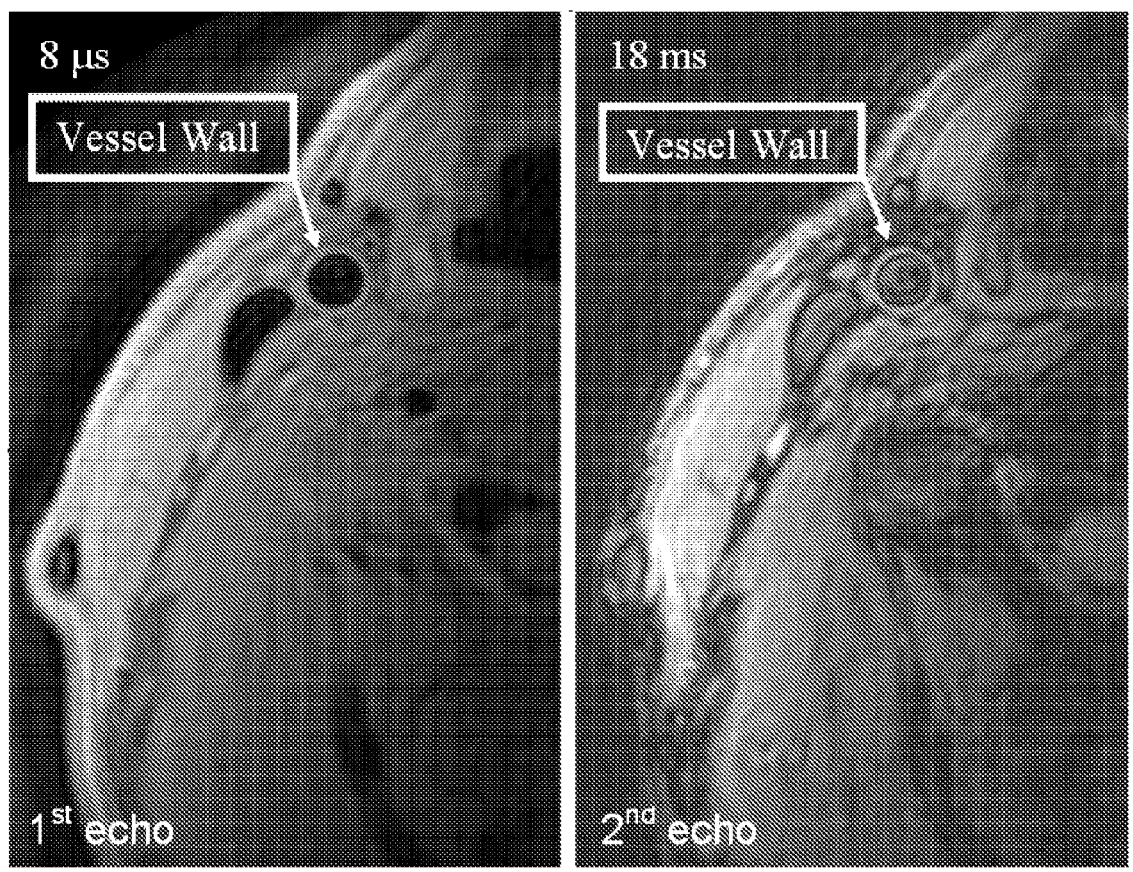
FIG. 13 illustrates example images obtained using dual echo DIR-SUTE.

In some implementations, a dual echo DIR spiral UTE sequence is implemented. FIG. 12 is a pulse sequence diagram depicting the dual echo DIR spiral UTE sequence 1200. In this sequence 1200, a dual echo spiral data acquisition is initiated after a double IR pulse and a half pulse excitation. The sequence 1200 includes a non-selective inversion pulse 1207, a slice-selective inversion pulse 1204, a half RF excitation pulse 1202, a first slice-selective magnetic filed gradient of a first polarity 1205, a second slice-selective magnetic field gradient of the first polarity 1206 and a second slice-selective magnetic field gradient of a second polarity 1208. Data acquisition is accomplished by applying spiral readout gradient pulses 1216 and 1218 to obtain images based on dual echoes 1212 and 1214. This sequence 1200 can be used to selectively depict the vessel wall. Furthermore, the dual echo DIR spiral UTE sequence 1200 may be implemented to depict iron/nanoparticle deposition in the vessel wall or intervertebral discs through subtraction of a first echo image from a second echo image. A sample image obtained using the dual echo DIR-SUTE sequence is shown in FIG. 13.

Figure 14A:
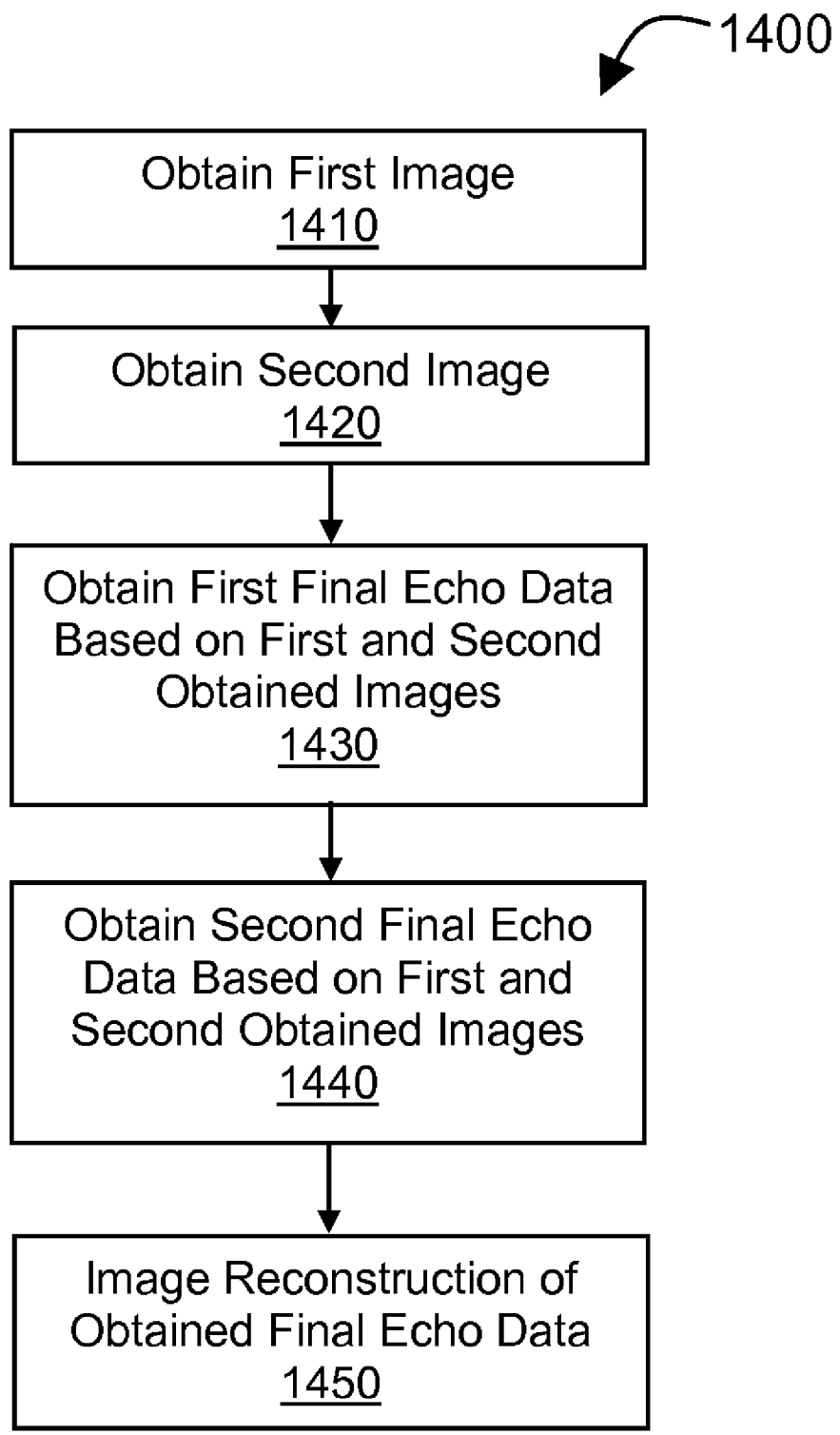
FIGS. 14A, 14B and 14C illustrate a process flow diagram of a method for obtaining MRI measurements using a dual echo DIR spiral UTE sequence.
Figure 14B:
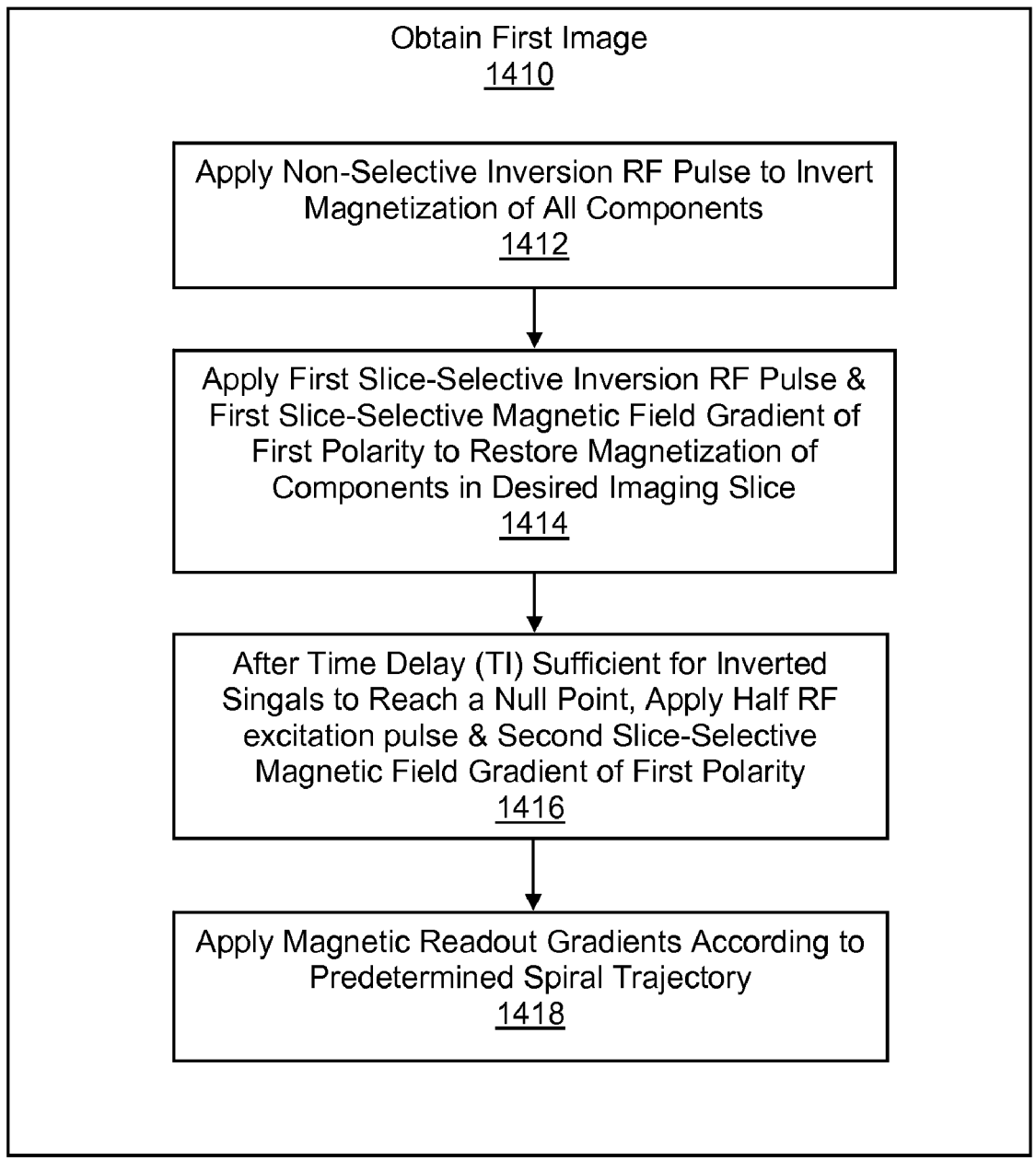
Figure 14C:
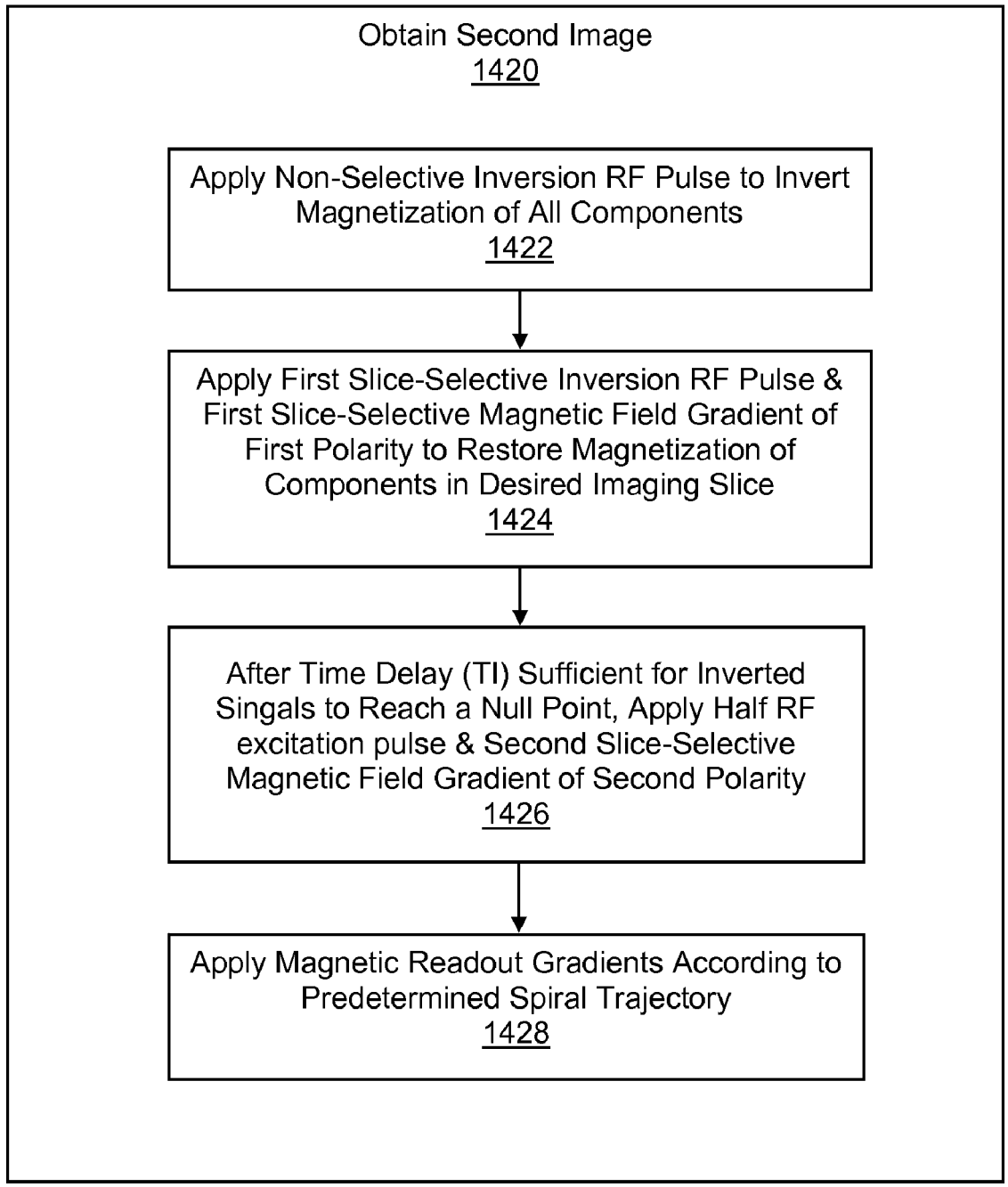

FIGS. 14A, 14B and 14C illustrate a process flow diagrams of a method 1400 for obtaining MRI measurements using a dual echo DIR spiral UTE sequence. This method 1400 includes obtaining a first image at 1410 by performing various operations. A non-selective inversion RF pulse is applied at 1412 to invert magnetization of all components including a signal from flowing blood in the sample. After applying the non-selective inversion RF pulse, a slice-selective inversion recovery RF pulse and a first slice-selective magnetic field gradient of a first polarity are applied to the sample at 1414 to restore the magnetization of components in an imaging slice of interest. After a time delay (TI) necessary for the magnetization of the inverted signal from blood flowing into the imaging slice to reach a null point, a half RF excitation pulse and a second slice-selective magnetic field gradient of the first polarity are applied at 1416. After applying the half RF excitation pulse and the second slice-selective magnetic field gradient of the first polarity, magnetic readout gradients are applied at 1418 along two orthogonal directions according to a predetermined spiral trajectory in the k-space to obtain a first echo data and a subsequent second echo data from the sample for the first image.

This method 1400 also includes obtaining a second image by performing various operations similar to those used to obtain the first image at 1420. For the second time, the non-selective inversion RF pulse is applied at 1422 to the sample to invert magnetization of all components including a signal from flowing blood in the sample. After applying the non-selective inversion RF pulse, the slice-selective inversion recovery RF pulse and the first slice-selective magnetic field gradient of the first polarity are applied to the sample at 1424 to restore the magnetization of components in the imaging slice of interest. After the time delay (TI) necessary for the magnetization of the inverted signal from blood flowing into the imaging slice to reach the null point, the half RF excitation pulse and a second slice-selective magnetic field gradient of a second polarity (and reverse of the first polarity) are applied to the sample at 1426. After applying the half RF excitation pulse and the second slice-selective magnetic field gradient of the second polarity, the magnetic readout gradients are applied along the two orthogonal directions according to the predetermined spiral trajectory in the k-space to obtain a first echo data and a subsequent second echo data from the sample for the second image at 1428.

This method 1300 further includes adding the obtained first echo data for the first image and the obtained first echo data for the second image to produce a final first echo image at 1430. The obtained second echo data for the first image and the obtained second echo data for the second image are added together to produce a final second echo image at 1440. In addition, a difference between the final first echo image and the final second echo image is used to obtain imaging information corresponding to short T2 components in the sample at 1450.

Figure 15:
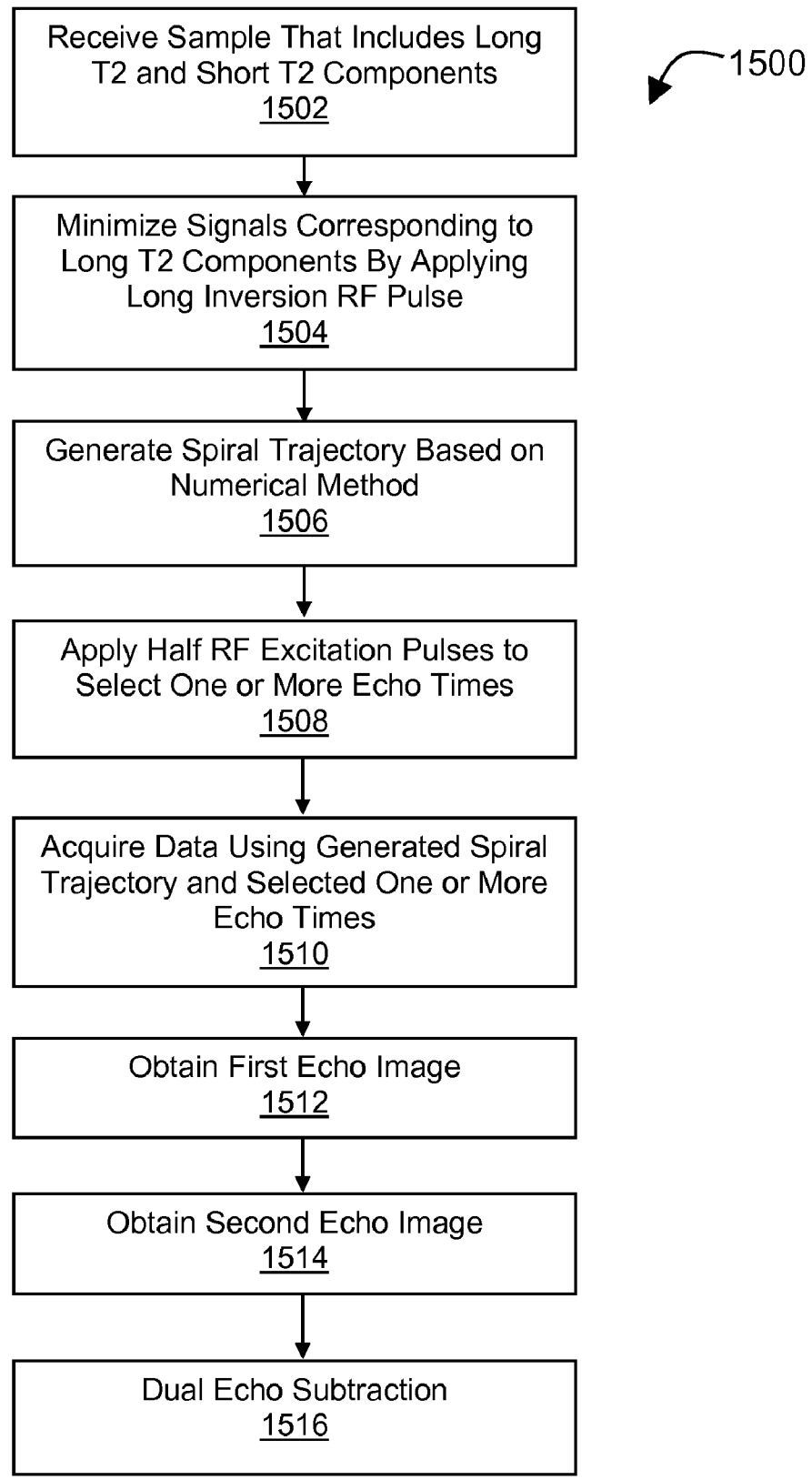
FIG. 15 is a process flow diagram of a method for obtaining imaging information of short T2 components in a sample.

FIG. 15 is a process flow diagram of a method 1500 for obtaining imaging data of short T2 components in a sample. A sample that includes long T2 components and short T2 components are received at 1502. At 1504, signals corresponding to the long T2 components are minimized by applying to the sample a long inversion RF pulse designed to invert magnetization of the long T2 components. A spiral trajectory is generated using a numerical method at 1506. Half RF excitation pulses are applied to the sample to select one or more echo times at 1508. Using the generated spiral trajectory, data corresponding to the selected one or more echo times are acquired at 1510. A first echo image is obtained based on the acquired data at 1512. Then a second echo image is obtained based on the acquired data at 1514. A difference between the obtained first echo image and the second echo image (e.g., dual echo subtraction) is determined to obtain image information corresponding to the short T2 components in the sample at 1516.

Figure 16:
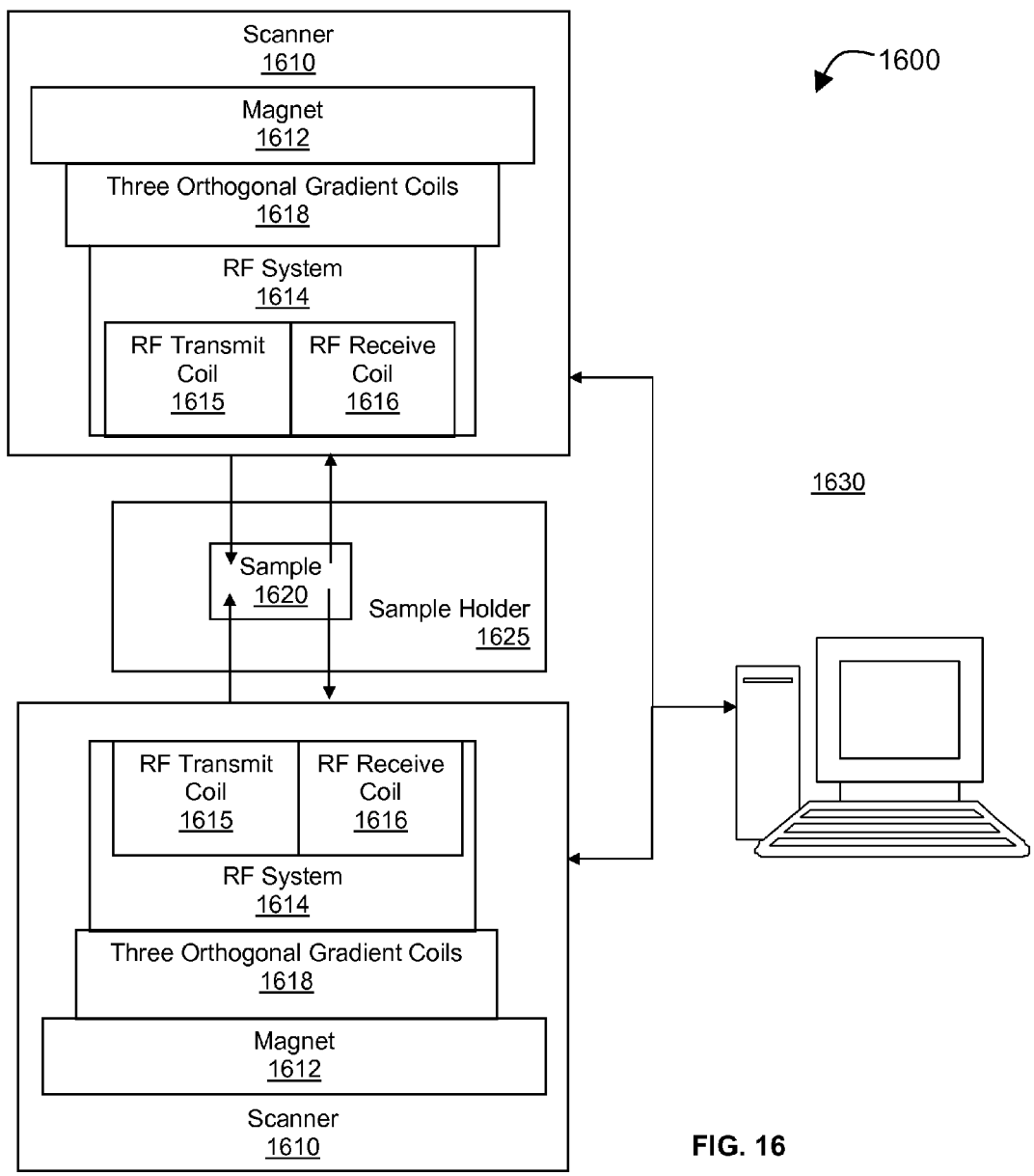
FIG. 16 is a block diagram of a MRI system.

Techniques as disclosed in this specifications can be implemented using a MRI system 1600 as illustrated in FIG. 16. The MRI system 1600 can be implemented using any one of various MRI scanners such as a 1.5 T Sigma TwinSpeed scanner (available from GE Healthcare Technologies, Milwaukee, Wis.) The MRI system 1600 includes a scanner 1610, a data processing apparatus 1630 and a sample holder or table 1625 for holding a sample 1620. The scanner includes a main magnet 1612, three orthogonal gradient coils 1618 and a RF system 1614. The main magnet 1612 is designed to provide a constant, homogeneous magnetic field. The three orthogonal gradient coils 1618 are designed to provide three orthogonal, controller magnetic gradients used to acquire image data of a desired slice by generating an encoded and slice-selective magnetic field. The RF system 1614 includes a RF transmit coil 1615 and a RF receive coil designed to transmit and receive RF pulses. The RF system 1645 can further include a RF synthesizer (not shown) and a power amplifier (not shown). In some implementations, an integrated transceiver coil (not shown) can be implemented instead of the separate transmit coil 1615 and receive coil 1616 for transmitting and receiving RF signals. For example, a close-fitting smaller coil can improve image quality when a small region is being imaged. Further, various types of coils that are placed around specific parts of a body (e.g., the head, knee, wrist, etc.) or even internally can be implemented depending on the sample and imaging applications.

The MRI system 1600 is designed to perform the techniques disclosed in this specification. In particular, the MRI system 1600 is designed to implement the methods disclosed with respect to FIGS. 2A, 2B, 2C, 11A, 11B, 11C, 14A, 14B, 14C and 15. The RF system 1614 is designed to apply to a sample 1620 a non-selective inversion RF pulse, a slice-selective inversion RF pulse and a half RF excitation pulse. The three orthogonal coils 1618 are designed to apply slice-selective magnetic field gradients (of a first polarity and a second polarity) and magnetic readout gradients. The data processing apparatus (e.g., a computer) 1630 is designed to receive and process the acquired data to obtain desired images corresponding to the short T2 components. For example, the data processing apparatus can perform the dual echo subtraction.

Figure 17:
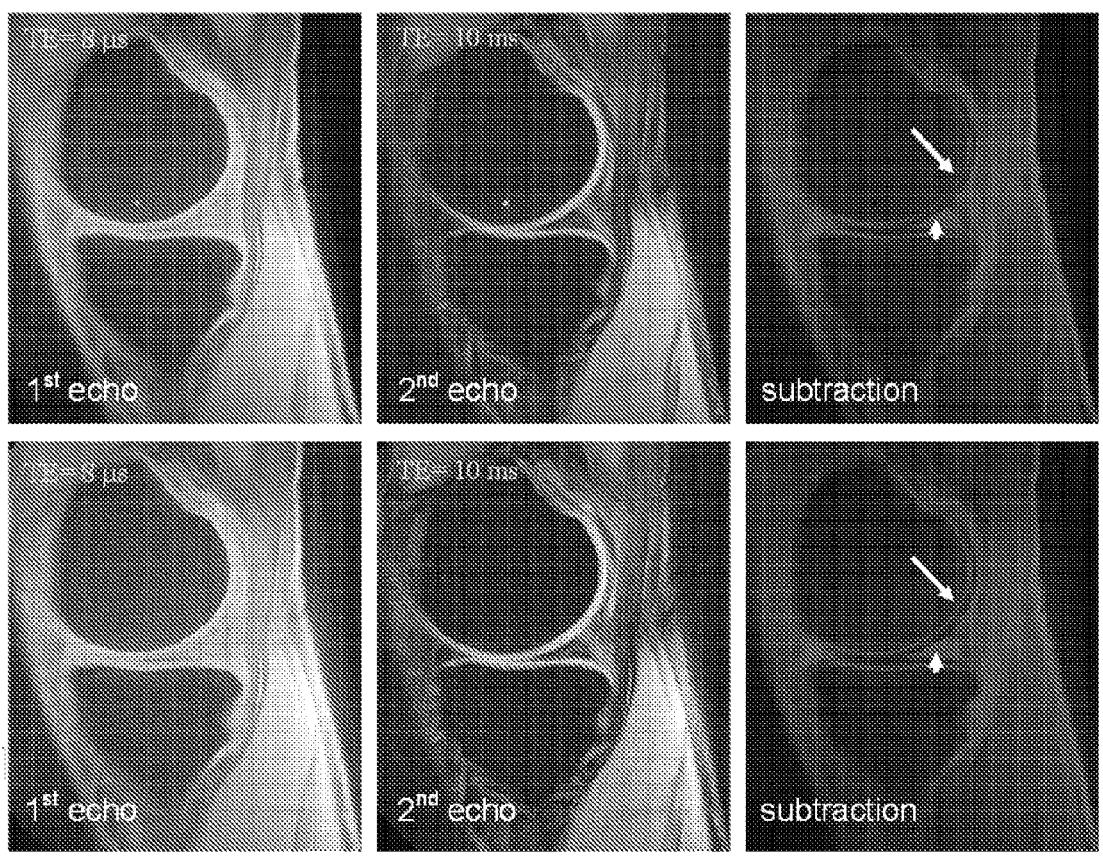
FIG. 17 shows a set of images obtained from a deep layer of cartilage that has short T2 components.

The deep layer of the cartilage has short T2 (around 1 millisecond), which can not be well depicted using conventional pulse sequence. the techniques as described in this specification can be implemented to selectively depict the deep layer cartilage, as well as menisci by subtracting image data from the second echo (TE=5~12 msec) from image data from the first echo (TE=8 μsec). The acquisition parameters for radial and spiral UTE are: FOV=21/16 cm, readout=512, BW=62.5 kHz, slice thickness=3 mm, pixel size=0.43 mm, TR=300 ms, projection=511, scan time=5 min. The corresponding images are shown in FIG. 17.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine-generated electrical, optical, or electromagnetic signal, that is generated to encode information for transmission to suitable receiver apparatus for execution by a computer. The computer readable medium can be a machine-readable storage device, a machine-readable storage substrate, a memory device, a composition of matter effecting a machine-readable propagated signal, or a combination of one or more of them.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Only a few implementations and examples are described and other implementations, enhancements and variations can be made based on what is described and illustrated in this application.

What is claimed is:

1. A method for magnetic resonance imaging (MRI) comprising:
    applying to a sample, which exhibits long transverse relaxation time (T2) components and short T2 components, a long inversion radio frequency (RF) pulse that inverts magnetization of the long T2 components to minimize signals corresponding to the long T2 components;
    applying half RF excitation pulses to the sample to select at least two echo times;
    adding one or more compensation gradients between each adjacent echo times of the at least two echo times to minimize gradient error and eddy current effect for data associated with the echo time that succeeds the one or more compensation gradients;
    adding a hysteresis gradient between the at least two echo times to generate a consistent rather than sinusoidal K-space offset for each spiral interleaf in the spiral trajectory;
    acquiring data corresponding to the selected the at least two echo times using a spiral trajectory; and
    obtaining a first echo image based on the acquired data.

2. The method of claim 1, further comprising obtaining a second echo image based on the acquired data.

3. The method of claim 2, further comprising determining a difference between the obtained first echo image and the second echo image to obtain imaging information corresponding to the short T2 components in the sample.

4. The method of claim 2, further comprising obtaining one or more additional echo images based on the acquired data.

5. A method for magnetic resonance imaging (MRI), comprising:
    obtaining a first image from a sample including
        applying to the sample a slice-selective long duration adiabatic inversion radio frequency (RF) pulse and a first slice-selective magnetic field gradient of a first polarity to invert magnetization of long transverse relaxation time (T2) components in the sample,
        after a time delay (T1) sufficient for the magnetization of the inverted long T2 components to reach a null point, applying to the sample a half RF excitation pulse and a second slice-selective magnetic field gradient of the first polarity, and
        after applying the half RF excitation pulse and the second slice-selective magnetic field gradient of the first polarity, applying magnetic readout gradients along two orthogonal directions according to a predetermined spiral trajectory in the k-space to obtain a first echo data and a subsequent second echo data from the sample;
    obtaining a second image from the sample including
        applying to the sample the slice-selective inversion RF pulse and the first slice-selective magnetic field gradient of the first polarity to invert magnetization of long T2 components in the sample,
        after the time delay (T1) sufficient for the magnetization of the inverted long T2 components to reach the null point, applying to the sample the half RF excitation pulse and a second slice-selective gradient of a second polarity and reverse of the first polarity, and
        after applying the half RF excitation pulse and the second slice-selective magnetic field gradient of the second polarity, applying the magnetic readout gradients along the two orthogonal directions according to the predetermined spiral trajectory in the k-space to obtain a first echo data and a subsequent second echo data from the sample;
    obtaining a slice profile including adding (1) the obtained first echo data for the first image and the obtained first echo data for the second image to produce a final first echo image, and (2) the obtained second echo data for the first image and the obtained second echo data for the second image to produce a final second echo image; and
    using a difference between the final first echo image and the final second echo image to obtain imaging information corresponding to short T2 components in the sample, wherein echo data obtained according to the predetermined spiral trajectory produces images with a higher signal-to-noise (SNR) efficiency value than images obtained using a radial trajectory.

6. The method of claim 5, wherein applying a first slice-selective magnetic field gradient of a first polarity comprises applying a first slice selective magnetic field gradient of a positive polarity.

7. A computer program product, embodied on a non-transitory computer-readable medium, operable to cause a data processing apparatus to perform operations comprising the method of claim 1.

8. The computer program product of claim 7, further operable to cause a data processing apparatus to obtain a second echo image based on the acquired data.

9. The computer program product of claim 8, further operable to cause a data processing apparatus to determining a difference between the obtained first echo image and the second echo image to obtain image information corresponding to the short T2 components in the sample.

10. The computer program product of claim 8, further operable to cause a data processing apparatus to obtain one or more additional echo images based on the acquired data.

11. The computer program product of claim 7, further operable to cause a data processing apparatus to add one or more compensation gradients that minimize gradient error and eddy current effect.

12. The computer program product of claim 11, further operable to cause a data processing apparatus to add a hysteresis gradient to generate a consistent rather than sinusoidal K-space offset for each spiral interleaf in the spiral trajectory.

13. A computer program product, embodied on a non-transitory computer-readable medium, operable to cause a data processing apparatus to perform operations comprising the method of claim 5.

14. The computer program product of claim 13, further operable to cause a data processing apparatus to apply a first slice selective magnetic field gradient of a positive polarity.

15. A magnetic resonance imaging (MRI) system comprising:
a radio frequency (RF) system configured to
apply to a sample, which exhibits long transverse relaxation time (T2) components and short T2 components, a long inversion radio frequency (RF) pulse that inverts magnetization of the components with the long T2 components to minimize signals corresponding to the long T2 components, and
apply half RF excitation pulses to the sample to select at least two echo times;
a gradient coil system configured to
add one or more compensation gradients between each adjacent echo times of the at least two echo times to minimize gradient error and eddy current effect for data associated with the echo time that succeeds the one or more compensation gradients, and
add a hysteresis gradient between the at least two echo times to generate a consistent rather than sinusoidal K-space offset for each spiral interleaf in the spiral trajectory; and
a data processing apparatus configured to
acquire data corresponding to the selected at least two echo times using a spiral trajectory, and
obtaining a first echo image based on the acquired data.

16. The MRI system of claim 15, wherein the data processing apparatus is further configured to obtain a second echo image based on the acquired data.

17. The MRI system of claim 16, wherein the data processing apparatus is further configured to determine a difference between the obtained first echo image and the second echo image to obtain imaging information corresponding to the short T2 components in the sample.

18. The MRI system of claim 16, wherein the data processing apparatus is further configured to obtain one or more additional echo images based on the acquired data.

19. A Magnetic Resonance Imaging (MRI) system, comprising:
a radio frequency (RF) system configured to apply RF pulses to a sample;
a gradient coil system configured to apply gradients to the sample;
a data processing system configured to acquire data;
wherein the radio frequency (RF) system is configured to apply to the sample a slice-selective long duration adiabatic inversion radio frequency (RF) pulse and the gradient coil system is configured to apply to the sample a first slice-selective magnetic field gradient of a first polarity to invert magnetization of long transverse relaxation time (T2) components in the sample;
wherein after a time delay (T1) sufficient for the magnetization of the inverted long T2 components to reach a null point, the RF system is further configured to apply to the sample a half RF excitation pulse and the gradient coil system further configured to apply a second slice-selective magnetic field gradient of the first polarity;
wherein after applying the half RF excitation pulse and the second slice-selective magnetic field gradient of the first polarity, the gradient coil system is further configured to apply magnetic readout gradients along two orthogonal directions according to a predetermined spiral trajectory in the k-space to obtain a first echo data and a subsequent second echo data from the sample;
wherein the data processing apparatus is configured to obtain a first image of the sample based on the obtained first echo data and the second echo data;
wherein after obtaining the first image, the RF system is further configured to apply to the sample the slice-selective inversion RF pulse and the gradient coil system is further configured to apply the first slice-selective magnetic field gradient of the first polarity to invert magnetization of long T2 components in the sample for a second time;
wherein after the time delay (T1) sufficient for the magnetization of the inverted long T2 components to reach the null point for the second time, the RF system is further configured to apply to the sample the half RF excitation pulse and the gradient coil system is further configured to apply a second slice-selective gradient of a second polarity and reverse of the first polarity;
wherein after applying the half RF excitation pulse and the second slice-selective magnetic field gradient of the second polarity, the gradient coil system is further configured to apply the magnetic readout gradients along the two orthogonal directions according to the predetermined spiral trajectory in the k-space to obtain a first echo data and a subsequent second echo data from the sample for the second time; and
wherein the data processing apparatus is further configured to
obtain a second image based on the first echo data and the second echo data obtained for the second time,
obtain a slice profile including adding (1) the obtained first echo data for the first image and the obtained first echo data for the second image to produce a final first echo image, and (2) the obtained second echo data for the first image and the obtained second echo data for the second image to produce a final second echo image, and
determine a difference between the final first echo image and the final second echo image to obtain imaging information corresponding to short T2 components in the sample, wherein echo data obtained according to the predetermined spiral trajectory produces images with a higher signal-to-noise (SNR) efficiency value than images obtained using a radial trajectory.

20. The MRI system of claim 19, wherein the gradient coil system is further configured to apply the first slice-selective magnetic field gradient of the first polarity by applying a first slice selective magnetic field gradient of a positive polarity.

* * * * *